United States Patent
Lomayev et al.

(10) Patent No.: US 11,337,219 B2
(45) Date of Patent: May 17, 2022

(54) APPARATUS, SYSTEM AND METHOD OF ENCODING A WIRELESS TRANSMISSION

(71) Applicant: INTEL CORPORATION, Santa Clara, CA (US)

(72) Inventors: Artyom Lomayev, Nizhny Novgorod (RU); Alexander Maltsev, Nizhny Novgorod (RU); Michael Genossar, Modiin (IL); Claudio Da Silva, Portland, OR (US); Carlos Cordeiro, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 16 days.

(21) Appl. No.: 16/831,540

(22) Filed: Mar. 26, 2020

(65) Prior Publication Data

US 2020/0228141 A1    Jul. 16, 2020

Related U.S. Application Data

(63) Continuation of application No. 16/624,463, filed as application No. PCT/US2018/038015 on Jun. 18, 2018.

(Continued)

(51) Int. Cl.
*H04W 72/04* (2009.01)
*H03M 13/29* (2006.01)
(Continued)

(52) U.S. Cl.
CPC ... *H04W 72/0466* (2013.01); *H03M 13/1157* (2013.01); *H03M 13/2903* (2013.01); *H04L 1/0061* (2013.01)

(58) Field of Classification Search
CPC ......... H04W 72/0466; H03M 13/2903; H03M 13/1157
See application file for complete search history.

(56) References Cited

U.S. PATENT DOCUMENTS

2005/0226414 A1* 10/2005 Lee ................... H04N 21/2347
                                                    380/210
2010/0115372 A1*  5/2010 Trachewsky ...... H03M 13/6362
                                                    714/752
(Continued)

FOREIGN PATENT DOCUMENTS

CN          103098402       5/2013
CN          104363192       2/2015
(Continued)

OTHER PUBLICATIONS

Office Action for U.S. Appl. No. 16/624,463, dated Apr. 8, 2021, 16 pages.

(Continued)

*Primary Examiner* — Joseph D Torres
(74) *Attorney, Agent, or Firm* — Shichrur & Co.

(57) ABSTRACT

For example, an Enhanced Directional Multi-Gigabit (DMG) (EDMG) wireless communication station (STA) may be configured to scramble, according to a first scrambling sequence, a plurality of EDMG Header B bits of an EDMG Header B field of an EDMG Multi-User (MU) Physical Layer (PHY) Protocol Data Unit (PPDU) into a plurality of scrambled header bits; generate a Low-Density Parity-Check (LDPC) codeword based on the plurality of scrambled header bits; determine a data block based on the LDPC codeword; generate one or more scrambled data blocks based on the data block by scrambling the data block according to a second scrambling sequence; and transmit a (Continued)

wireless transmission of the EDMG Header B based on the one or more scrambled data blocks.

24 Claims, 6 Drawing Sheets

Related U.S. Application Data

(60) Provisional application No. 62/522,180, filed on Jun. 20, 2017, provisional application No. 62/521,803, filed on Jun. 19, 2017.

(51) Int. Cl.
*H03M 13/11* (2006.01)
*H04L 1/00* (2006.01)

(56) References Cited

U.S. PATENT DOCUMENTS

| | | | |
|---|---|---|---|
| 2012/0183003 A1* | 7/2012 | Hwang | H04N 21/2383 370/474 |
| 2014/0334476 A1 | 11/2014 | Cheong et al. | |
| 2015/0016396 A1 | 1/2015 | Gaal et al. | |
| 2015/0282183 A1 | 10/2015 | Sverdlov et al. | |
| 2016/0249332 A1 | 8/2016 | Xin et al. | |
| 2017/0033949 A1 | 2/2017 | Eitan et al. | |
| 2017/0048095 A1 | 2/2017 | Sun et al. | |
| 2020/0228140 A1 | 7/2020 | Lomayev et al. | |

FOREIGN PATENT DOCUMENTS

| | | |
|---|---|---|
| WO | 2015/094257 | 6/2015 |
| WO | 2016/175944 | 11/2016 |
| WO | 2017/014551 | 1/2017 |
| WO | 2017/043911 | 3/2017 |
| WO | 2017043912 | 3/2017 |
| WO | 2018/183081 | 10/2018 |
| WO | 2018/183231 | 10/2018 |
| WO | 2018/222224 | 12/2018 |

OTHER PUBLICATIONS

International Search Report and the Written Opinion for International Application No. PCT/US2018/038015, dated Oct. 1, 2018, 13 pages.
INTEL, '30.6.4 Encoding of EDMG-Header-B for OFDM Mode', doc.:IEEE 802.11-17/0755r0, May 7, 2017, 8 pages.
INTEL, 'MCS 1 LDPC Encoding Method Modification in 11ay', doc.:IEEE 802.11-17/0879r0, Jun. 13, 2017, 17 pages.
INTEL, 'EDMG Header-B Encoding and Modulation for SC PHY in 11ay', doc.:IEEE 802.11-16/0989r0, Jul. 25, 2016, 14 pages.
IEEE Std 802.11™-2016. IEEE Standard for Information technology—Telecommunications and information exchange between systems Local and metropolitan area networks—Specific requirements Part 11: Wireless LAN Medium Access Control (MAC) and Physical Layer (PHY) Specifications, Dec. 7, 2016, 3534 pages.
International Preliminary Report on Patentability for International Application No. PCT/US2018/038015, dated Jan. 2, 2020, 10 pages.
Search Report for European Patent Application No. 18774908.0, dated Nov. 27, 2020, 14 pages.
Takenori Sakamoto et al., "EDMG A-PPDU for 11ay SC mode", IEEE 802.11-17/0051R3, Jan. 17, 2017, 13 pages.
Office Action for U.S. Appl. No. 16/624,463, dated Dec. 31, 2020, 29 pages.
International Search Report and Written Opinion for International Application No. PCT/US2017/066276, dated Apr. 16, 2018, 12 pages.
International Preliminary Report on Patentability for International Application No. PCT/US2017/066276, dated Dec. 12, 2019, 9 pages.
International Search Report and Written Opinion for International Application No. PCT/US2018/024427, dated Jul. 12, 2018, 9 pages.
International Preliminary Report on Patentability for International Application No. PCT/US2018/024427, dated Oct. 10, 2019, 6 pages.
Artyom Lomayev et al., "Non-EDMG Part of Preamble for MIMO in 11ay", IEEE 802.11-16/0988r1, Jul. 25, 2016, 19 pages.
International Search Report and Written Opinion for International Application No. PCT/US2018/023770, dated Jul. 11, 2018, 14 pages.
International Preliminary Report on Patentability for International Application No. PCT/US2018/023770, dated Oct. 10, 2019, 11 pages.
Office Action for Chinese Patent Application No. 201880018454.8, dated Jan. 26, 2022, 8 pages.

\* cited by examiner

APPARATUS, SYSTEM AND METHOD OF ENCODING A WIRELESS TRANSMISSION

CROSS REFERENCE

This application claims the benefit of and priority from U.S. Provisional Patent Application No. 62/521,803 entitled "Apparatus, System and Method of Encoding a Wireless Transmission", filed Jun. 19, 2017, and U.S. Provisional Patent Application No. 62/522,180 entitled "Apparatus, System and Method of Encoding a Wireless Transmission", filed Jun. 20, 2017, the entire disclosures of which are incorporated herein by reference.

TECHNICAL FIELD

Embodiments described herein generally relate to encoding a wireless transmission.

BACKGROUND

A wireless communication network in a millimeter-wave band may provide high-speed data access for users of wireless communication devices.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
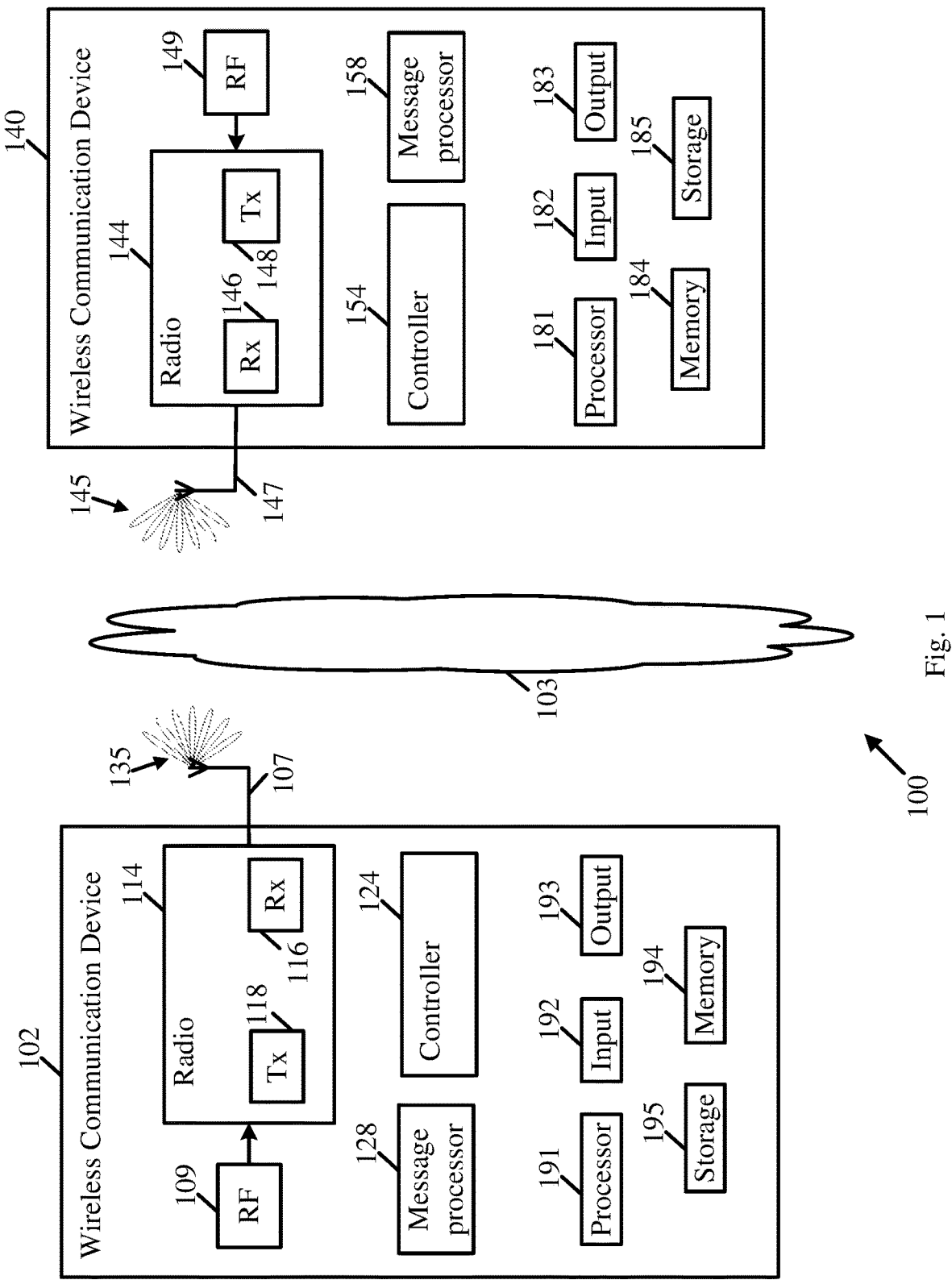
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a handheld device, a wearable device, a sensor device, an Internet of Things (IoT) device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with devices and/or networks operating in accordance with existing IEEE 802.11 standards (including IEEE 802.11-2016 (*IEEE 802.11-2016, IEEE Standard for Information technology—Telecommunications and information exchange between systems Local and metropolitan area networks—Specific requirements Part 11: Wireless LAN Medium Access Control (MAC) and Physical Layer (PHY) Specifications, Dec. 7, 2016*); and/or IEEE 802.11ay (*P802.11ay/D1.0 Draft Standard for Information Technology—Telecommunications and Information Exchange Between Systems—Local and Metropolitan Area Networks—Specific Requirements Part 11: Wireless LAN Medium Access Control (MAC) and Physical Layer (PHY) Specifications—Amendment 7: Enhanced Throughput for Operation in License Exempt Bands Above 45 GHz, November 2017*)) and/or future versions and/or derivatives thereof, devices and/or networks operating in accordance with existing WFA Peer-to-Peer (P2P) specifications (*WiFi P2P technical specification, version 1.7, Jul. 6, 2016*) and/or future versions and/or derivatives thereof, devices and/or networks operating in accordance with existing Wireless-Gigabit-Alliance (WGA) specifications (including *Wireless Gigabit Alliance, Inc WiGig MAC and PHY Specification Version* 1.1, *April* 2011, *Final specification*) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Orthogonal Frequency-Division Multiple Access (OFDMA), FDM Time-Division Multiplexing (TDM), Time-Division Multiple Access (TDMA), Multi-User MIMO (MU-MIMO), Spatial Division Multiple Access (SDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G), or Sixth Generation (6G) mobile networks, 3GPP, Long Term Evolution (LTE), LTE advanced, Enhanced Data rates for GSM Evolution (EDGE), or the like. Other embodiments may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device. The communication signal may be transmitted and/or received, for example, in the form of Radio Frequency (RF) communication signals, and/or any other type of signal.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

Some demonstrative embodiments may be used in conjunction with a WLAN, e.g., a WiFi network. Other embodiments may be used in conjunction with any other suitable wireless communication network, for example, a wireless area network, a "piconet", a WPAN, a WVAN and the like.

Some demonstrative embodiments may be used in conjunction with a wireless communication network communicating over a frequency band above 45 Gigahertz (GHz), e.g., 60 GHz. However, other embodiments may be implemented utilizing any other suitable wireless communication frequency bands, for example, an Extremely High Frequency (EHF) band (the millimeter wave (mmWave) frequency band), e.g., a frequency band within the frequency band of between 20 Ghz and 300 GHz, a frequency band above 45 GHz, a 5G frequency band, a frequency band below 20 GHz, e.g., a Sub 1 GHz (S1G) band, a 2.4 GHz band, a 5 GHz band, a WLAN frequency band, a WPAN frequency band, a frequency band according to the WGA specification, and the like.

The term "antenna", as used herein, may include any suitable configuration, structure and/or arrangement of one or more antenna elements, components, units, assemblies and/or arrays. In some embodiments, the antenna may implement transmit and receive functionalities using separate transmit and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

The phrases "directional multi-gigabit (DMG)" and "directional band" (DBand), as used herein, may relate to a frequency band wherein the Channel starting frequency is above 45 GHz. In one example, DMG communications may involve one or more directional links to communicate at a rate of multiple gigabits per second, for example, at least 1 Gigabit per second, e.g., at least 7 Gigabit per second, at least 30 Gigabit per second, or any other rate.

Some demonstrative embodiments may be implemented by a DMG STA (also referred to as a "mmWave STA (mSTA)"), which may include for example, a STA having a radio transmitter, which is capable of operating on a channel that is within the DMG band. The DMG STA may perform other additional or alternative functionality. Other embodiments may be implemented by any other apparatus, device and/or station.

Reference is made to FIG. 1, which schematically illustrates a system 100, in accordance with some demonstrative embodiments.

As shown in FIG. 1, in some demonstrative embodiments, system 100 may include one or more wireless communication devices. For example, system 100 may include a wireless communication device 102, a wireless communication device 140, and/or one more other devices.

In some demonstrative embodiments, devices 102 and/or 140 may include a mobile device or a non-mobile, e.g., a static, device.

For example, devices 102 and/or 140 may include, for example, a UE, an MD, a STA, an AP, a PC, a desktop computer, a mobile computer, a laptop computer, an Ultrabook™ computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a media player, a Smartphone, a television, a music player, or the like.

In some demonstrative embodiments, device 102 may include, for example, one or more of a processor 191, an input unit 192, an output unit 193, a memory unit 194, and/or a storage unit 195; and/or device 140 may include, for example, one or more of a processor 181, an input unit 182, an output unit 183, a memory unit 184, and/or a storage unit 185. Devices 102 and/or 140 may optionally include other suitable hardware components and/or software components. In some demonstrative embodiments, some or all of the components of one or more of devices 102 and/or 140 may be enclosed in a common housing or packaging, and may be interconnected or operably associated using one or more wired or wireless links. In other embodiments, components of one or more of devices 102 and/or 140 may be distributed among multiple or separate devices.

In some demonstrative embodiments, processor 191 and/or processor 181 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 may execute instructions, for example, of an Operating System (OS) of device 102 and/or of one or more suitable applications. Processor 181 may execute instructions, for example, of an Operating System (OS) of device 140 and/or of one or more suitable applications.

In some demonstrative embodiments, input unit 192 and/or input unit 182 may include, for example, a keyboard, a keypad, a mouse, a touch-screen, a touch-pad, a track-ball, a stylus, a microphone, or other suitable pointing device or input device. Output unit 193 and/or output unit 183 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 194 and/or memory unit 184 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195 and/or storage unit 185 may include, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102. Memory unit 184 and/or storage unit 185, for example, may store data processed by device 140.

In some demonstrative embodiments, wireless communication devices 102 and/or 140 may be capable of communicating content, data, information and/or signals via a wireless medium (WM) 103. In some demonstrative embodiments, wireless medium 103 may include, for example, a radio channel, a cellular channel, an RF channel, a WiFi channel, a 5G channel, an IR channel, a Bluetooth (BT) channel, a Global Navigation Satellite System (GNSS) Channel, and the like.

In some demonstrative embodiments, WM 103 may include one or more directional bands and/or channels. For example, WM 103 may include one or more millimeter-wave (mmWave) wireless communication bands and/or channels.

In some demonstrative embodiments, WM 103 may include one or more DMG channels. In other embodiments WM 103 may include any other directional channels.

In other embodiments, WM 103 may include any other type of channel over any other frequency band.

In some demonstrative embodiments, device 102 and/or device 140 may include one or more radios including circuitry and/or logic to perform wireless communication between devices 102, 140 and/or one or more other wireless communication devices. For example, device 102 may include at least one radio 114, and/or device 140 may include at least one radio 144.

In some demonstrative embodiments, radio 114 and/or radio 144 may include one or more wireless receivers (Rx) including circuitry and/or logic to receive wireless communication signals, RF signals, frames, blocks, transmission streams, packets, messages, data items, and/or data. For example, radio 114 may include at least one receiver 116, and/or radio 144 may include at least one receiver 146.

In some demonstrative embodiments, radio 114 and/or radio 144 may include one or more wireless transmitters (Tx) including circuitry and/or logic to transmit wireless communication signals, RF signals, frames, blocks, transmission streams, packets, messages, data items, and/or data. For example, radio 114 may include at least one transmitter 118, and/or radio 144 may include at least one transmitter 148.

In some demonstrative embodiments, radio 114 and/or radio 144, transmitters 118 and/or 148, and/or receivers 116 and/or 146 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like. For example, radio 114 and/or radio 144 may include or may be implemented as part of a wireless Network Interface Card (NIC), and the like.

In some demonstrative embodiments, radios 114 and/or 144 may be configured to communicate over a directional band, for example, an mmWave band, a 5G band, and/or any other band, for example, a 2.4 GHz band, a 5 GHz band, a S1G band, and/or any other band.

In some demonstrative embodiments, radios 114 and/or 144 may include, or may be associated with one or more, e.g., a plurality of, directional antennas.

In some demonstrative embodiments, device 102 may include one or more, e.g., a plurality of, directional antennas 107, and/or device 140 may include on or more, e.g., a plurality of, directional antennas 147.

Antennas 107 and/or 147 may include any type of antennas suitable for transmitting and/or receiving wireless communication signals, blocks, frames, transmission streams, packets, messages and/or data. For example, antennas 107 and/or 147 may include any suitable configuration, structure and/or arrangement of one or more antenna elements, components, units, assemblies and/or arrays. Antennas 107 and/or 147 may include, for example, antennas suitable for directional communication, e.g., using beamforming techniques. For example, antennas 107 and/or 147 may include a phased array antenna, a multiple element antenna, a set of switched beam antennas, and/or the like. In some embodiments, antennas 107 and/or 147 may implement transmit and receive functionalities using separate transmit and receive antenna elements. In some embodiments, antennas 107 and/or 147 may implement transmit and receive functionalities using common and/or integrated transmit/receive elements.

In some demonstrative embodiments, antennas 107 and/or 147 may include directional antennas, which may be steered to one or more beam directions. For example, antennas 107 may be steered to one or more beam directions 135, and/or antennas 147 may be steered to one or more beam directions 145.

In some demonstrative embodiments, antennas 107 and/or 147 may include and/or may be implemented as part of a single Phased Antenna Array (PAA).

In some demonstrative embodiments, antennas 107 and/or 147 may be implemented as part of a plurality of PAAs, for example, as a plurality of physically independent PAAs.

In some demonstrative embodiments, a PAA may include, for example, a rectangular geometry, e.g., including an integer number, denoted M, of rows, and an integer number, denoted N, of columns. In other embodiments, any other types of antennas and/or antenna arrays may be used.

In some demonstrative embodiments, antennas 107 and/or antennas 147 may be connected to, and/or associated with, one or more Radio Frequency (RF) chains.

In some demonstrative embodiments, device 102 may include one or more, e.g., a plurality of, RF chains 109 connected to, and/or associated with, antennas 107.

In some demonstrative embodiments, one or more of RF chains 109 may be included as part of, and/or implemented as part of one or more elements of radio 114, e.g., as part of transmitter 118 and/or receiver 116.

In some demonstrative embodiments, device 140 may include one or more, e.g., a plurality of, RF chains 149 connected to, and/or associated with, antennas 147.

In some demonstrative embodiments, one or more of RF chains 149 may be included as part of, and/or implemented as part of one or more elements of radio 144, e.g., as part of transmitter 148 and/or receiver 146.

In some demonstrative embodiments, device 102 may include a controller 124, and/or device 140 may include a controller 154. Controller 124 may be configured to perform and/or to trigger, cause, instruct and/or control device 102 to perform, one or more communications, to generate and/or communicate one or more messages and/or transmissions, and/or to perform one or more functionalities, operations and/or procedures between devices 102, 140 and/or one or more other devices; and/or controller 154 may be configured to perform, and/or to trigger, cause, instruct and/or control device 140 to perform, one or more communications, to generate and/or communicate one or more messages and/or transmissions, and/or to perform one or more functionalities, operations and/or procedures between devices 102, 140 and/or one or more other devices, e.g., as described below.

In some demonstrative embodiments, controllers 124 and/or 154 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, baseband (BB) circuitry and/or logic, a BB processor, a BB memory, Application Processor (AP) circuitry and/or logic, an AP processor, an AP memory, and/or any other circuitry and/or logic, configured to perform the functionality of controllers 124 and/or 154, respectively. Additionally or alternatively, one or more functionalities of controllers 124 and/or 154 may be implemented by logic, which may be executed by a machine and/or one or more processors, e.g., as described below.

In one example, controller 124 may include circuitry and/or logic, for example, one or more processors including circuitry and/or logic, to cause, trigger and/or control a wireless device, e.g., device 102, and/or a wireless station, e.g., a wireless STA implemented by device 102, to perform one or more operations, communications and/or functionalities, e.g., as described herein. In one example, controller 124 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In one example, controller 154 may include circuitry and/or logic, for example, one or more processors including circuitry and/or logic, to cause, trigger and/or control a wireless device, e.g., device 140, and/or a wireless station, e.g., a wireless STA implemented by device 140, to perform one or more operations, communications and/or functionalities, e.g., as described herein. In one example, controller 154 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In some demonstrative embodiments, device 102 may include a message processor 128 configured to generate, process and/or access one or messages communicated by device 102.

In one example, message processor 128 may be configured to generate one or more messages to be transmitted by device 102, and/or message processor 128 may be configured to access and/or to process one or more messages received by device 102, e.g., as described below.

In one example, message processor 128 may include at least one first component configured to generate a message, for example, in the form of a frame, field, information element and/or protocol data unit, for example, a MAC Protocol Data Unit (MPDU); at least one second component configured to convert the message into a PHY Protocol Data Unit (PPDU), for example, by processing the message generated by the at least one first component, e.g., by encoding the message, modulating the message and/or performing any other additional or alternative processing of the message; and/or at least one third component configured to cause transmission of the message over a wireless communication medium, e.g., over a wireless communication channel in a wireless communication frequency band, for example, by applying to one or more fields of the PPDU one or more transmit waveforms. In other embodiments, message processor 128 may be configured to perform any other additional or alternative functionality and/or may include any other additional or alternative components to generate and/or process a message to be transmitted.

In some demonstrative embodiments, device 140 may include a message processor 158 configured to generate, process and/or access one or messages communicated by device 140.

In one example, message processor 158 may be configured to generate one or more messages to be transmitted by device 140, and/or message processor 158 may be configured to access and/or to process one or more messages received by device 140, e.g., as described below.

In one example, message processor 158 may include at least one first component configured to generate a message, for example, in the form of a frame, field, information element and/or protocol data unit, for example, a MAC Protocol Data Unit (MPDU); at least one second component configured to convert the message into a PHY Protocol Data Unit (PPDU), for example, by processing the message generated by the at least one first component, e.g., by encoding the message, modulating the message and/or performing any other additional or alternative processing of the message; and/or at least one third component configured to cause transmission of the message over a wireless communication medium, e.g., over a wireless communication channel in a wireless communication frequency band, for example, by applying to one or more fields of the PPDU one or more transmit waveforms. In other embodiments, message processor 158 may be configured to perform any other additional or alternative functionality and/or may include any other additional or alternative components to generate and/or process a message to be transmitted.

In some demonstrative embodiments, message processors 128 and/or 158 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, BB circuitry and/or logic, a BB processor, a BB memory, AP circuitry and/or logic, an AP processor, an AP memory, and/or any other circuitry and/or logic, configured to perform the functionality of message processors 128 and/or 158, respectively. Additionally or alternatively, one or more functionalities of message processors 128 and/or 158 may be implemented by logic, which may be executed by a machine and/or one or more processors, e.g., as described below.

In some demonstrative embodiments, at least part of the functionality of message processor 128 may be implemented as part of radio 114, and/or at least part of the functionality of message processor 158 may be implemented as part of radio 144.

In some demonstrative embodiments, at least part of the functionality of message processor 128 may be implemented as part of controller 124, and/or at least part of the functionality of message processor 158 may be implemented as part of controller 154.

In other embodiments, the functionality of message processor 128 may be implemented as part of any other element of device 102, and/or the functionality of message processor 158 may be implemented as part of any other element of device 140.

In some demonstrative embodiments, at least part of the functionality of controller 124 and/or message processor 128 may be implemented by an integrated circuit, for example, a chip, e.g., a System on Chip (SoC). In one example, the chip or SoC may be configured to perform one or more functionalities of radio 114. For example, the chip or SoC may include one or more elements of controller 124, one or more elements of message processor 128, and/or one or more elements of radio 114.

In one example, controller 124, message processor 128, and radio 114 may be implemented as part of the chip or SoC.

In other embodiments, controller 124, message processor 128 and/or radio 114 may be implemented by one or more additional or alternative elements of device 102.

In some demonstrative embodiments, at least part of the functionality of controller 154 and/or message processor 158 may be implemented by an integrated circuit, for example, a chip, e.g., a System on Chip (SoC). In one example, the chip or SoC may be configured to perform one or more functionalities of radio 144. For example, the chip or SoC may include one or more elements of controller 154, one or more elements of message processor 158, and/or one or more elements of radio 144.

In one example, controller 154, message processor 158, and radio 144 may be implemented as part of the chip or SoC.

In other embodiments, controller 154, message processor 158 and/or radio 144 may be implemented by one or more additional or alternative elements of device 140.

In some demonstrative embodiments, device 102 and/or device 140 may include, operate as, perform the role of, and/or perform one or more functionalities of, one or more STAs. For example, device 102 may include at least one STA, and/or device 140 may include at least one STA.

In some demonstrative embodiments, device 102 and/or device 140 may include, operate as, perform the role of, and/or perform one or more functionalities of, one or more DMG STAs. For example, device 102 may include, operate as, perform the role of, and/or perform one or more functionalities of, at least one DMG STA, and/or device 140 may include, operate as, perform the role of, and/or perform one or more functionalities of, at least one DMG STA.

In other embodiments, devices 102 and/or 140 may include, operate as, perform the role of, and/or perform one or more functionalities of, any other wireless device and/or station, e.g., a WLAN STA, a WiFi STA, and the like.

In some demonstrative embodiments, device 102 and/or device 140 may be configured operate as, perform the role of, and/or perform one or more functionalities of, an access point (AP), e.g., a DMG AP, and/or a personal basic service set (PBSS) control point (PCP), e.g., a DMG PCP, for example, an AP/PCP STA, e.g., a DMG AP/PCP STA.

In some demonstrative embodiments, device 102 and/or device 140 may be configured to operate as, perform the role of, and/or perform one or more functionalities of, a non-AP STA, e.g., a DMG non-AP STA, and/or a non-PCP STA, e.g., a DMG non-PCP STA, for example, a non-AP/PCP STA, e.g., a DMG non-AP/PCP STA.

In other embodiments, device 102 and/or device 140 may operate as, perform the role of, and/or perform one or more functionalities of, any other additional or alternative device and/or station.

In one example, a station (STA) may include a logical entity that is a singly addressable instance of a medium access control (MAC) and physical layer (PHY) interface to the wireless medium (WM). The STA may perform any other additional or alternative functionality.

In one example, an AP may include an entity that contains a station (STA), e.g., one STA, and provides access to distribution services, via the wireless medium (WM) for associated STAs. The AP may perform any other additional or alternative functionality.

In one example, a personal basic service set (PBSS) control point (PCP) may include an entity that contains a STA, e.g., one station (STA), and coordinates access to the wireless medium (WM) by STAs that are members of a PBSS. The PCP may perform any other additional or alternative functionality.

In one example, a PBSS may include a directional multi-gigabit (DMG) basic service set (BSS) that includes, for example, one PBSS control point (PCP). For example, access to a distribution system (DS) may not be present, but, for example, an intra-PBSS forwarding service may optionally be present.

In one example, a PCP/AP STA may include a station (STA) that is at least one of a PCP or an AP. The PCP/AP STA may perform any other additional or alternative functionality.

In one example, a non-AP STA may include a STA that is not contained within an AP. The non-AP STA may perform any other additional or alternative functionality.

In one example, a non-PCP STA may include a STA that is not a PCP. The non-PCP STA may perform any other additional or alternative functionality.

In one example, a non PCP/AP STA may include a STA that is not a PCP and that is not an AP. The non-PCP/AP STA may perform any other additional or alternative functionality.

In some demonstrative embodiments devices 102 and/or 140 may be configured to communicate over a Next Generation 60 GHz (NG60) network, an Enhanced DMG (EDMG) network, and/or any other network. For example, devices 102 and/or 140 may perform Multiple-Input-Multiple-Output (MIMO) communication, for example, for communicating over the NG60 and/or EDMG networks, e.g., over an NG60 or an EDMG frequency band.

In some demonstrative embodiments, devices 102 and/or 140 may be configured to operate in accordance with one or more Specifications, for example, including one or more *IEEE* 802.11 *Specifications*, e.g., an *IEEE* 802.11-2016 *Specification*, an *IEEE* 802.11*ay Specification*, and/or any other specification and/or protocol.

Some demonstrative embodiments may be implemented, for example, as part of a new standard in an mmWave band, e.g., a 60 GHz frequency band or any other directional band, for example, as an evolution of an *IEEE* 802.11-2016 *Specification* and/or an *IEEE* 802.11*ad Specification*.

In some demonstrative embodiments, devices 102 and/or 140 may be configured according to one or more standards, for example, in accordance with an *IEEE* 802.11*ay Standard*, which may be, for example, configured to enhance the efficiency and/or performance of an *IEEE* 802.11*ad Specification*, which may be configured to provide Wi-Fi connectivity in a 60 GHz band.

Some demonstrative embodiments may enable, for example, to significantly increase the data transmission rates defined in the *IEEE* 802.11*ad Specification*, for example, from 7 Gigabit per second (Gbps), e.g., up to 30 Gbps, or to any other data rate, which may, for example, satisfy growing demand in network capacity for new coming applications.

Some demonstrative embodiments may be implemented, for example, to allow increasing a transmission data rate, for example, by applying MIMO and/or channel bonding techniques.

In some demonstrative embodiments, devices 102 and/or 140 may be configured to communicate MIMO communications over the mmWave wireless communication band.

In some demonstrative embodiments, device 102 and/or device 140 may be configured to support one or more mechanisms and/or features, for example, channel bonding, Single User (SU) MIMO, and/or Multi-User (MU) MIMO, for example, in accordance with an *IEEE* 802.11*ay Standard* and/or any other standard and/or protocol.

In some demonstrative embodiments, device 102 and/or device 140 may include, operate as, perform a role of, and/or perform the functionality of, one or more EDMG STAs. For example, device 102 may include, operate as, perform a role of, and/or perform the functionality of, at least one EDMG STA, and/or device 140 may include, operate as, perform a role of, and/or perform the functionality of, at least one EDMG STA.

In some demonstrative embodiments, devices 102 and/or 140 may implement a communication scheme, which may include Physical layer (PHY) and/or Media Access Control (MAC) layer schemes, for example, to support one or more applications, and/or increased transmission data rates, e.g., data rates of up to 30 Gbps, or any other data rate.

In some demonstrative embodiments, the PHY and/or MAC layer schemes may be configured to support frequency channel bonding over a mmWave band, e.g., over a 60 GHz band, SU MIMO techniques, and/or MU MIMO techniques.

In some demonstrative embodiments, devices 102 and/or 140 may be configured to implement one or more mechanisms, which may be configured to enable SU and/or MU communication of Downlink (DL) and/or Uplink frames (UL) using a MIMO scheme.

In some demonstrative embodiments, device 102 and/or device 140 may be configured to implement one or more MU communication mechanisms. For example, devices 102 and/or 140 may be configured to implement one or more MU mechanisms, which may be configured to enable MU communication of DL frames using a MIMO scheme, for example, between a device, e.g., device 102, and a plurality of devices, e.g., including device 140 and/or one or more other devices.

In some demonstrative embodiments, devices 102 and/or 140 may be configured to communicate over an NG60 network, an EDMG network, and/or any other network and/or any other frequency band. For example, devices 102 and/or 140 may be configured to communicate DL MIMO transmissions and/or UL MIMO transmissions, for example, for communicating over the NG60 and/or EDMG networks.

Some wireless communication Specifications, for example, the *IEEE* 802.11*ad*-2012 *Specification*, may be configured to support a SU system, in which a STA may transmit frames to a single STA at a time. Such Specifications may not be able, for example, to support a STA transmitting to multiple STAs simultaneously, for example, using a MU-MIMO scheme, e.g., a DL MU-MIMO, or any other MU scheme.

In some demonstrative embodiments, devices 102 and/or 140 may be configured to communicate over a channel bandwidth, e.g., of at least 2.16 GHz, in a frequency band above 45 GHz.

In some demonstrative embodiments, devices 102 and/or 140 may be configured to implement one or more mechanisms, which may, for example, enable to extend a single-channel BW scheme, e.g., a scheme in accordance with the *IEEE* 802.11*ad Specification* or any other scheme, for higher data rates and/or increased capabilities, e.g., as described below.

In one example, the single-channel BW scheme may include communication over a 2.16 GHz channel (also referred to as a "single-channel" or a "DMG channel").

In some demonstrative embodiments, devices 102 and/or 140 may be configured to implement one or more channel bonding mechanisms, which may, for example, support communication over a channel BW (also referred to as a "wide channel", an "EDMG channel", or a "bonded channel") including two or more channels, e.g., two or more 2.16 GHz channels, e.g., as described below.

In some demonstrative embodiments, the channel bonding mechanisms may include, for example, a mechanism and/or an operation whereby two or more channels, e.g., 2.16 GHz channels, can be combined, e.g., for a higher bandwidth of packet transmission, for example, to enable achieving higher data rates, e.g., when compared to transmissions over a single channel. Some demonstrative embodiments are described herein with respect to communication over a channel BW including two or more 2.16 GHz channels, however other embodiments may be implemented with respect to communications over a channel bandwidth, e.g., a "wide" channel, including or formed by any other number of two or more channels, for example, an aggregated channel including an aggregation of two or more channels.

In some demonstrative embodiments, device 102 and/or device 140 may be configured to implement one or more channel bonding mechanisms, which may, for example, support an increased channel bandwidth, for example, a channel BW of 4.32 GHz, a channel BW of 6.48 GHz, a channel BW of 8.64 GHz, and/or any other additional or alternative channel BW, e.g., as described below.

In some demonstrative embodiments, device 102 and/or device 140 may be configured to implement one or more channel bonding mechanisms, which may, for example, support an increased channel bandwidth, for example, a channel BW of 4.32 GHz, e.g., including two 2.16 Ghz channels according to a channel bonding factor of two, a channel BW of 6.48 GHz, e.g., including three 2.16 Ghz channels according to a channel bonding factor of three, a channel BW of 8.64 GHz, e.g., including four 2.16 Ghz channels according to a channel bonding factor of four, and/or any other additional or alternative channel BW, e.g., including any other number of 2.16 Ghz channels and/or according to any other channel bonding factor.

In some demonstrative embodiments, device 102 and/or device 140 may be configured to communicate one or more transmissions over one or more channel BWs, for example, including a channel BW of 2.16 GHz, a channel BW of 4.32 GHz, a channel BW of 6.48 GHz, a channel BW of 8.64 GHz and/or any other channel BW.

In some demonstrative embodiments, introduction of MIMO may be based, for example, on implementing robust transmission modes and/or enhancing the reliability of data transmission, e.g., rather than the transmission rate, compared to a Single Input Single Output (SISO) case. For example, one or more Space Time Block Coding (STBC) schemes utilizing a space-time channel diversity property may be implemented to achieve one or more enhancements for the MIMO transmission.

In some demonstrative embodiments, devices 102 and/or 140 may be configured to generate, process, transmit and/or receive a Physical Layer (PHY) Protocol Data Unit (PPDU) having a PPDU format (also referred to as "EDMG PPDU format"), which may be configured, for example, for communication between EDMG stations, e.g., as described below.

In some demonstrative embodiments, a PPDU, e.g., an EDMG PPDU, may include at least one non-EDMG fields, e.g., a legacy field, which may be identified, decodable, and/or processed by one or more devices ("non-EDMG devices", or "legacy devices"), which may not support one or more features and/or mechanisms ("non-legacy" mechanisms or "EDMG mechanisms"). For example, the legacy devices may include non-EDMG stations, which may be, for example, configured according to an *IEEE* 802.11-2016 *Standard*, and the like. For example, a non-EDMG station may include a DMG station, which is not an EDMG station.

Figure 2:
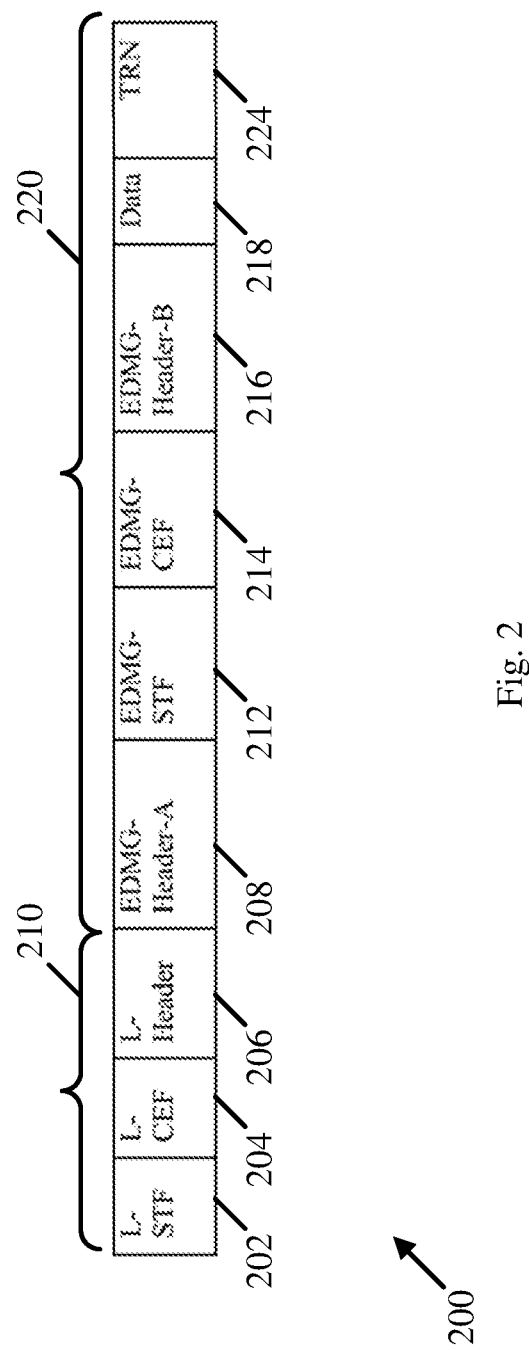
FIG. 2 is a schematic illustration of an Enhanced Directional Multi-Gigabit (EDMG) Physical Layer Protocol Data Unit (PPDU) format, which may be implemented in accordance with some demonstrative embodiments.

Reference is made to FIG. 2, which schematically illustrates an EDMG PPDU format 200, which may be implemented in accordance with some demonstrative embodiments. In one example, devices 102 (FIG. 1) and/or 140

(FIG. 1) may be configured to generate, transmit, receive and/or process one or more EDMG PPDUs having the structure and/or format of EDMG PPDU 200.

In one example, devices 102 (FIG. 1) and/or 140 (FIG. 1) may communicate PPDU 200, for example, as part of a transmission over a channel, e.g., an EDMG channel, having a channel bandwidth including one or more 2.16 GHz channels, for example, including a channel BW of 2.16 GHz, a channel BW of 4.32 GHz, a channel BW of 6.48 GHz, a channel BW of 8.64 GHz, and/or any other channel BW, e.g., as described below.

In some demonstrative embodiments, as shown in FIG. 2, EDMG PPDU 200 may include a non-EDMG portion 210 ("legacy portion"), e.g., as described below.

In some demonstrative embodiments, as shown in FIG. 2, non-EDMG portion 210 may include a non-EDMG (legacy) Short Training Field (STF) (L-STF) 202, a non-EDMG (Legacy) Channel Estimation Field (CEF) (L-CEF) 204, and/or a non-EDMG header (L-header) 206.

In some demonstrative embodiments, as shown in FIG. 2, EDMG PPDU 200, may include an EDMG portion 220, for example, following non-EDMG portion 210, e.g., as described below.

In some demonstrative embodiments, as shown in FIG. 2, EDMG portion 220 may include a first EDMG header, e.g., an EDMG-Header-A 208, an EDMG-STF 212, an EDMG-CEF 214, a second EDMG header, e.g., an EDMG-Header-B 216, a Data field 218, and/or one or more beamforming training fields, e.g., a TRN field 224.

In some demonstrative embodiments, EDMG portion 220 may include some or all of the fields shown in FIG. 2 and/or one or more other additional or alternative fields.

In some demonstrative embodiments, EDMG-Header-B field 216 may be included, for example, in EDMG MU PPDUs, for example, on a per STA basis.

In some demonstrative embodiments, EDMG-Header-B field 216 corresponding to a STA addressed by the EDMG MU PPDU may include, for example, information relating to a transmission of a data unit, for example, a PHY Service Data Unit (PSDU) to the STA.

In some demonstrative embodiments, EDMG Header B field 216 may include for example, 64 bits, e.g., as described below. In other embodiments, the EDMG Header B field 216 may include any other number of bits.

In one example, EDMG Header B field 216 corresponding to the STA may include, for example, at least a scrambler seed field, a PSDU length field, e.g., to indicate a length of the PSDU to the STA, and/or one or more Modulation and Coding Scheme (MCS) fields to indicate one or more MCSs. For example, the Header B field may include first and second MCS fields to indicate MCSs for first and second respective spatial streams.

In other embodiments, EDMG Header B field 216 may include any other additional or alternative fields and/or information.

Referring back to FIG. 1, in some demonstrative embodiments, devices 102 and/or 140 may be configured to generate, transmit, receive and/or process one or more transmissions including a header field, for example, a Header B field, e.g., EDMG-Header-B field 216 (FIG. 2), which may be configured, for example, for EDMG Single Carrier (SC) and/or OFDM PHY, e.g., as described below.

In some demonstrative embodiments, devices 102 and/or 140 may be configured to encode and/or decode one or more portions and/or fields of a PPDU, e.g., EDMG PPDU 200 (FIG. 2), according to an encoding scheme, e.g., as described below.

In some demonstrative embodiments, devices 102 and/or 140 may be configured to encode an EDMG Header of an EDMG PPDU, for example, EDMG Header B 216 of EDMG PPDU 200 (FIG. 2), e.g., in accordance with an *IEEE 802.11ay Specification* and/or any other Specification.

In some demonstrative embodiments, devices 102 and/or 140 may be configured to generate, transmit, receive and/or process an EDMG PPDU, for example, an EDMG MU PPDU, including the EDMG-Header-B, e.g., EDMG Header B 216 (FIG. 2), which may be included in the MU PPDU, for example, to deliver parameters, e.g., on a per user (or STA) basis. In one example, the EDMG PPDU may include, for example, a plurality of EDMG Header B fields 216 (FIG. 2) corresponding to a respective plurality of users addressed by the EDMG PPDU.

In some demonstrative embodiments, devices 102 and/or 140 may be configured to generate, transmit, receive and/or process the EDMG Header B field according to an encoding scheme, which may be configured, for example, to support transmission over a 2.16 GHz channel, and/or one or more wide (bonded) channels, for example, transmission over a channel bandwidth of 4.32 GHz, 6.48 GHz, 8.64 GHz and/or any other channels bandwidths and/or bonded channels.

In some demonstrative embodiments, devices 102 and/or 140 may be configured to generate, transmit, receive and/or process the EDMG Header B field according to an encoding scheme, which may be configured, for example, to support transmission of the EDMG-Header-B using single or multiple space-time streams, e.g., as described below.

In some demonstrative embodiments, devices 102 and/or 140 may be configured to generate, determine and/or define the EDMG-Header-B field, for example, according to an encoding procedure for a SC PHY, e.g., as described below.

In some demonstrative embodiments, devices 102 and/or 140 may be configured to generate, determine and/or define the EDMG-Header-B field, for example, according to an encoding procedure for an OFDM PHY, e.g., as described below.

In some demonstrative embodiments, devices 102 and/or 140 may be configured to encode and/or decode at least an EDMG Header B field of an EDMG PPDU, for example, EDMG Header B 216 of EDMG PPDU 200 (FIG. 2), according to an encoding scheme, which may be configured, for example, to allow at least solving a technical problem of avoiding signal repetition, for example, at a transform period, e.g., a Discrete Fourier Transform (DFT) period, which may be implemented, for example, in an *IEEE 802.11.ay Specification* and/or any other Specification. In one example, multiple repetition of the signal, e.g., in case of channel bonding, may cause signal spectrum issues.

Some demonstrative embodiments are described herein with respect to an encoding scheme to encode an EDMG Header B of an EDMG PPDU. In other embodiments, the encoding scheme may be implemented to encode one or more additional or alternative fields of the EDMG PPDU and/or of any other type of PPDU.

In some demonstrative embodiments, devices 102 and/or 140 may be configured to generate, encode, transmit, receive, decode and/or process an EDMG Header B field of an EDMG PPDU, for example, EDMG Header B 216 of EDMG PPDU 200 (FIG. 2), according to an EDMG Header B encoding scheme, e.g., as described below.

In some demonstrative embodiments, the EDMG Header B encoding scheme may include encoding an EDMG Header B field for an $i_{user}$-th user, e.g., as described below.

In some demonstrative embodiments, the EDMG Header B field for the $i_{user}$-th user may include, for example, 64 bits, e.g., as described below. In other embodiments, the EDMG Header B field may include any other number of bits, e.g., less than or greater than 64 bits.

In some demonstrative embodiments, encoding the EDMG Header B field according to the EDMG Header B encoding scheme may include, for example, scrambling data of the EDMG Header B according to a first scrambling sequence, which may be based on a first polynomial, to generate a plurality of scrambled bits, e.g., as described below.

In some demonstrative embodiments, encoding the EDMG Header B field according to the EDMG Header B encoding scheme may include, for example, generating a data block based on the scrambled bits, e.g., as described below.

In some demonstrative embodiments, encoding the EDMG Header B field according to the EDMG Header B encoding scheme may include, for example, scrambling the data block according to a second scrambling sequence, which may be based on a second polynomial, to generate a scrambled data block, e.g., as described below.

In some demonstrative embodiments, devices 102 and/or 140 may be configured to transmit the EDMG Header B of the EDMG PPDU by transmitting a transmission based on the scrambled data block, e.g., as described below.

In some demonstrative embodiments, devices 102 and/or 140 may be configured to transmit the EDMG Header B of the EDMG PPDU by transmitting a transmission, e.g., a SC transmission of a SC signal, based on the scrambled data block, e.g., as described below.

In some demonstrative embodiments, devices 102 and/or 140 may be configured to transmit the EDMG Header B of the EDMG PPDU by transmitting a transmission, e.g., an OFDM transmission of an OFDM signal over a plurality of OFDM subcarriers, based on the scrambled data block, e.g., as described below.

In some demonstrative embodiments, encoding the EDMG Header B according to the EDMG Header B encoding scheme may include, for example, applying to the scrambled data block a circular shift, which is based on a transmit chain index to transmit the scrambled data block, e.g., as described below.

In some demonstrative embodiments, devices 102 and/or 140 may be configured to encode the EDMG Header B field, for example, by scrambling a plurality of bits of the EDMG Header B field, e.g., 64 bits or any other number of bits, to generate a plurality of scrambled header bits. For example, the plurality of bits of the EDMG Header B field may be scrambled with a first Pseudo Noise (PN) sequence generated by a first Linear Feedback Shift Register (LFSR) defined by a first primitive polynomial, e.g., as described below.

In some demonstrative embodiments, devices 102 and/or 140 may be configured to encode the EDMG Header B field, for example, by generating a codeword, for example, a Low-Density Parity-Check (LDPC) codeword, for example, by concatenating a plurality of zero bits (zeros) to the scrambled header bits, determining a plurality of parity bits based on an LDPC matrix, and concatenating the plurality of parity bits, for example, after the plurality of zeros, e.g., as described below.

In some demonstrative embodiments, devices 102 and/or 140 may be configured to encode the EDMG Header B field, for example, by determining a data block based on the LDPC codeword, for example, based at least on a channel bonding factor and/or a channel bandwidth for transmission of the EDMG PPDU, e.g., as described below.

In some demonstrative embodiments, devices 102 and/or 140 may be configured to encode the EDMG Header B field, for example, by determining a codeword sequence based on the LDPC codeword, and determining the data block to include a repetition of the codeword sequence based at least a channel bonding factor and/or a channel bandwidth for transmission of the EDMG PPDU, e.g., as described below.

In some demonstrative embodiments, devices 102 and/or 140 may be configured to encode the EDMG Header B field, for example, by scrambling the data block with a second PN sequence generated by a second LFSR defined by a second primitive polynomial, for example, to generate a scrambled data block, e.g., as described below. For example, the second LFSR may be different from the first LFSR, and/or the second primitive polynomial may be different from the first primitive polynomial.

In some demonstrative embodiments, devices 102 and/or 140 may be configured to encode the EDMG Header B field, for example, by applying to the scrambled data block a circular shift, which is based on a transmit chain index to transmit the scrambled data block, e.g., as described below.

In some demonstrative embodiments, devices 102 and/or 140 may be configured to transmit the EDMG Header B field of the EDMG PPDU, for example, by transmitting a transmission based on the scrambled data block.

In some demonstrative embodiments, devices 102 and/or 140 may be configured to generate the transmission, for example, by modulating the scrambled data block and/or mapping the scrambled data block to one or more space-time streams, e.g., as described below.

In some demonstrative embodiments, controller 124 may be configured to cause, trigger, and/or control a wireless station implemented by device 102, e.g., an EDMG STA, to scramble, according to a first scrambling sequence, a plurality of EDMG Header B bits of an EDMG Header B field of an EDMG MU PHY PPDU into a plurality of scrambled header bits, e.g., as described below.

In some demonstrative embodiments, the first scrambling sequence may be based on a first polynomial, e.g., as described below.

For example, device 102 may scramble a plurality of EDMG Header B bits of EDMG Header B field 216 (FIG. 2) of EDMG PPDU (FIG. 2), for example, according to the first scrambling sequence, which is based on the first polynomial.

In some demonstrative embodiments, controller 124 may be configured to cause, trigger, and/or control the wireless station implemented by device 102 to generate an LDPC codeword based on the plurality of scrambled header bits, e.g., as described below.

In some demonstrative embodiments, controller 124 may be configured to cause, trigger, and/or control the wireless station implemented by device 102 to determine a data block based on the LDPC codeword, e.g., as described below.

In some demonstrative embodiments, controller 124 may be configured to cause, trigger, and/or control the wireless station implemented by device 102 to generate one or more scrambled data blocks based on the data block, for example, by scrambling the data block according to a second scrambling sequence, e.g., as described below.

In some demonstrative embodiments, the second scrambling sequence may be based on a second polynomial, which is different from the first polynomial, e.g., as described below.

In some demonstrative embodiments, controller 124 may be configured to cause, trigger, and/or control the wireless station implemented by device 102 to transmit a wireless transmission of the EDMG Header B based on the one or more scrambled data blocks, e.g., as described below.

In some demonstrative embodiments, controller 124 may be configured to cause, trigger, and/or control the wireless station implemented by device 102 to transmit the wireless transmission of the EDMG Header B, e.g., EDMG-Header-B 216 (FIG. 2), over a frequency band above 45 GHz, e.g., as described below.

In other embodiments, device 102 may transmit the wireless transmission of the EDMG Header B over any other frequency band.

In some demonstrative embodiments, controller 124 may be configured to cause, trigger, and/or control the wireless station implemented by device 102 to transmit the wireless transmission of the EDMG Header B, e.g., EDMG-Header-B 216 (FIG. 2), over a channel bandwidth of 2.16 GHz, 4.32 GHz, 6.48 GHz, or 8.64 GHz, e.g., as described below.

In other embodiments, device 102 may transmit the wireless transmission of the EDMG Header B over any other channel bandwidth.

In some demonstrative embodiments, the first polynomial may include the polynomial $S(x)=x^7+x^4+1$, e.g., as described below.

In other embodiments, the first polynomial may include any other polynomial.

In some demonstrative embodiments, the second polynomial may include the polynomial $S(x)=x^7+x+1$, e.g., as described below.

In other embodiments, the second polynomial may include any other polynomial.

In some demonstrative embodiments, controller 124 may be configured to cause, trigger, and/or control the wireless station implemented by device 102 to determine the one or more scrambled data blocks, for example, according to an initial seed value equal to all ones $(1_1, 1_2, \ldots, 1_7)$, e.g., as described below.

In other embodiments, device 102 may determine the one or more scrambled data blocks according to any other initial seed value.

In some demonstrative embodiments, controller 124 may be configured to cause, trigger, and/or control the wireless station implemented by device 102 to start scrambling the data block at a $225^{th}$ bit, e.g., as described below.

In other embodiments, device 102 may start scrambling the data block at any other bit.

In some demonstrative embodiments, a count of the one or more scrambled data blocks may be based on a count of one or more space-time streams for transmission of the EDMG MU PPDU, e.g., as described below.

In some demonstrative embodiments, controller 124 may be configured to cause, trigger, and/or control the wireless station implemented by device 102 to map the one or more scrambled data blocks to one or more respective space-time streams for transmission of the EDMG MU PPDU, for example, EDMG PPDU 200 (FIG. 2), e.g., as described below.

In some demonstrative embodiments, controller 124 may be configured to cause, trigger, and/or control the wireless station implemented by device 102 to generate a first scrambled data block and a second scrambled block, e.g., as described below.

In some demonstrative embodiments, controller 124 may be configured to cause, trigger, and/or control the wireless station implemented by device 102 to map the first scrambled data block to a first space-time stream, and to map the second scrambled data block to a second space-time stream, e.g., as described below.

In some demonstrative embodiments, controller 124 may be configured to cause, trigger, and/or control the wireless station implemented by device 102 to determine a plurality of parity bits based on the plurality of scrambled header bits, and to generate the LDPC codeword based on the plurality of scrambled header bits and the plurality of parity bits, e.g., as described below.

In some demonstrative embodiments, controller 124 may be configured to cause, trigger, and/or control the wireless station implemented by device 102 to determine a codeword sequence based on the LDPC codeword, and to determine the data block to include one or more repetitions of the codeword sequence, e.g., as described below.

In some demonstrative embodiments, a count of the one or more repetitions of the codeword sequence may be based on a count of one or more 2.16 GHz channels in a channel bandwidth for transmission of the EDMG MU PPDU, e.g., as described below.

In some demonstrative embodiments, controller 124 may be configured to cause, trigger, and/or control the wireless station implemented by device 102 to generate the plurality of scrambled header bits according to a scrambler seed initialized by first seven bits of the EDMG Header B bits, e.g., as described below. In other embodiments, any other scrambler seed may be used.

In some demonstrative embodiments, devices 102 and/or 140 may be configured to implement a first Linear Feedback Shift Register (LFSR) configured according to the first polynomial, for example, to generate the first scrambling sequence, e.g., as described below.

In some demonstrative embodiments, devices 102 and/or 140 may be configured to implement a second LFSR configured according to the second polynomial, for example, to generate the second scrambling sequence, e.g., as described below.

Figure 3:
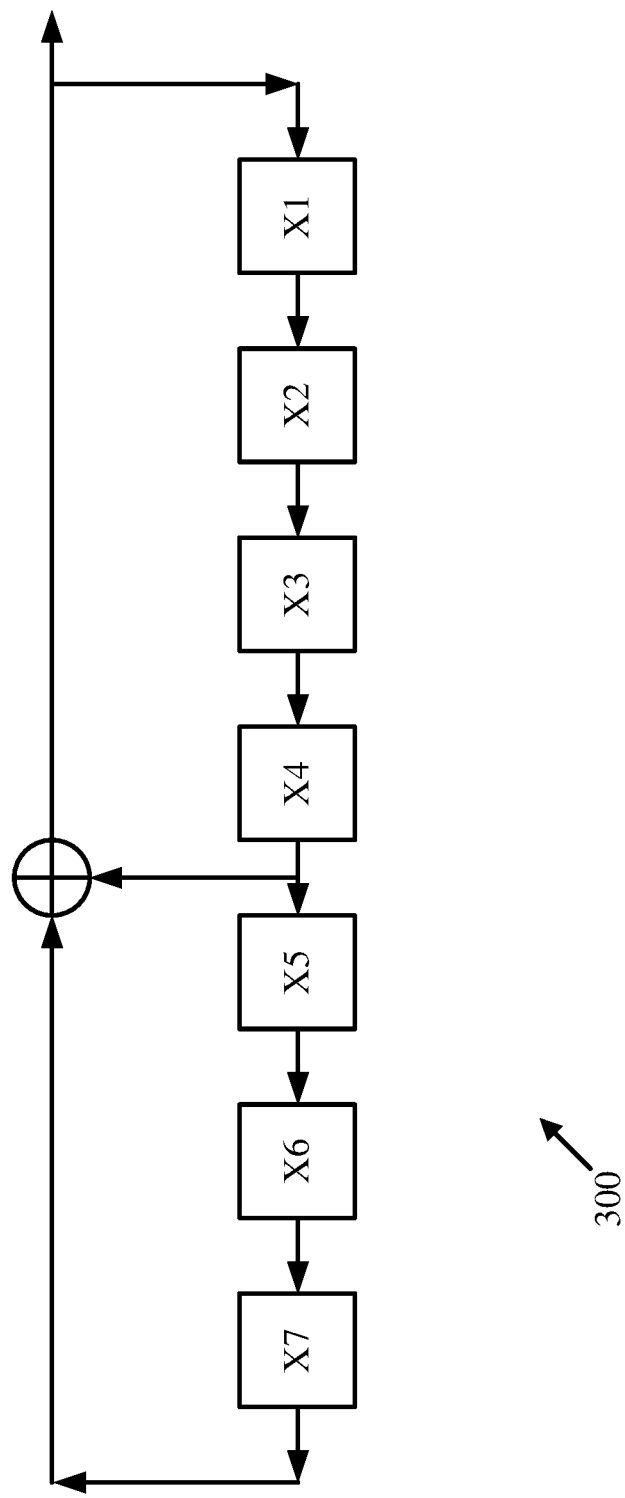
FIG. 3 is a schematic illustration of a first Linear Feedback Shift Register (LFSR), which may be implemented in accordance with some demonstrative embodiments.

Reference is made to FIG. 3, which schematically illustrates a first LFSR 300, which may be implemented to generate a scrambling sequence, e.g., a random PN sequence, in accordance with some demonstrative embodiments.

In some demonstrative embodiments, devices 102 and/or 140 (FIG. 1) may be configured to implement LFSR 300 to generate the first scrambling sequence.

In other embodiments, any other additional or alternative LFSR scheme may be implemented.

In some demonstrative embodiments, LFSR 300 may be implemented, for example, to scramble the data bits of the EDMG Header B, e.g., EDMG Header B 216 (FIG. 2), according to a first scrambling sequence, for example, to generate the scrambled bits, e.g., as described above.

In some demonstrative embodiments, for example, LFSR 300 may be defined by the primitive polynomial $S(x)=x^7+x^4+1$, for example, to generate a first random PN sequence.

In some demonstrative embodiments, as shown in FIG. 3, LFSR 300 may be configured to generate a periodic sequence, e.g., of length 127 or any other length, for example, based on the polynomial $x^7+x^4+1$, for example, based on a plurality of bit values, denoted x1, x2, ..., x7.

In other embodiments, LFSR 300 may be configured to generate a periodic sequence based on any other polynomial.

In some demonstrative embodiments, for example, start seed values applied to LFSR 300 may be, for example, based on a 7-bit value, e.g., from 1 up to 127, e.g., excluding a zero seed value.

For example, LFSR 300 may be configured to generate the random PN sequence s1. For example, start seed values may be from 1 up to 127, e.g., excluding a zero seed value.

Figure 4:
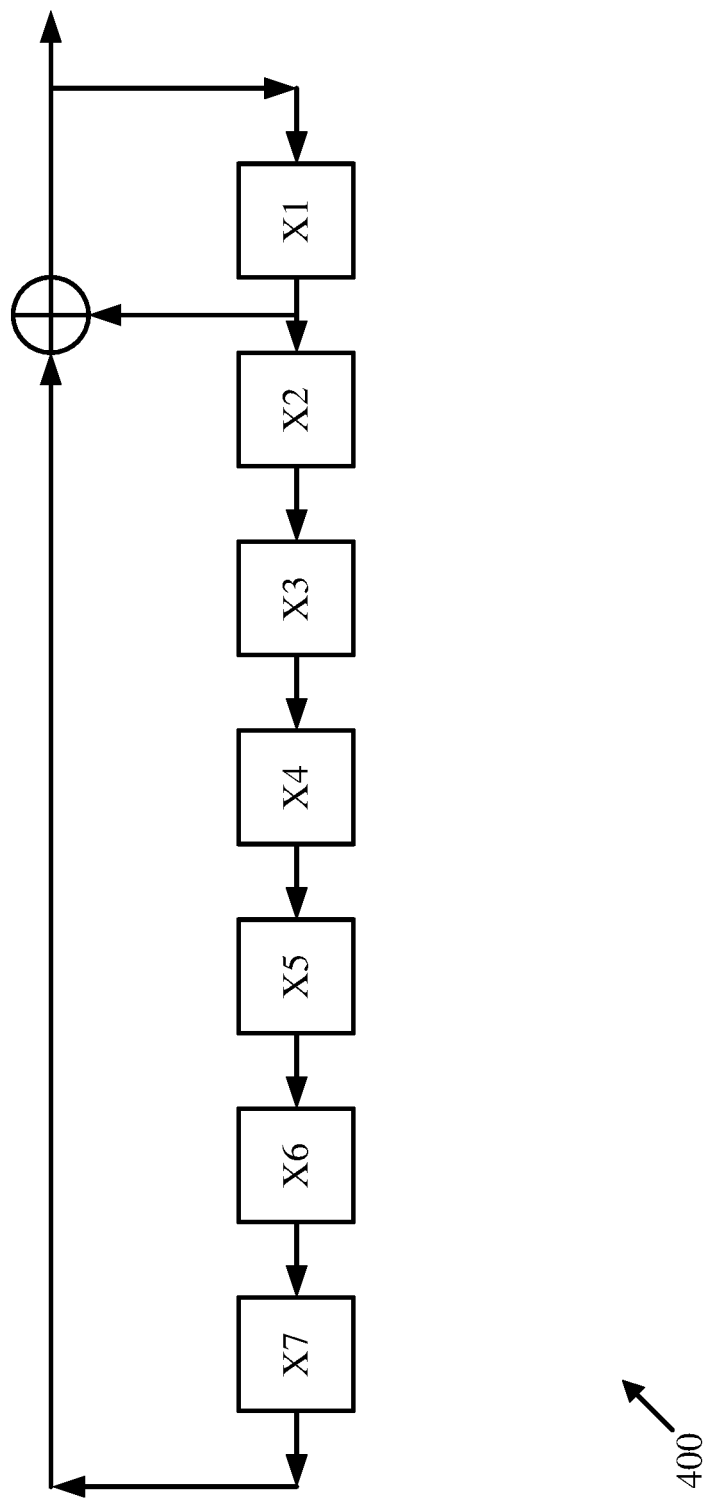
FIG. 4 is a schematic illustration of a second LFSR, which may be implemented in accordance with some demonstrative embodiments.

Reference is made to FIG. 4, which schematically illustrates a second LFSR, e.g., LFSR 400, which may be implemented in accordance with some demonstrative embodiments.

In some demonstrative embodiments, LFSR 400 may be implemented, for example, to scramble the data block of the EDMG Header B according to a second scrambling sequence, for example, to generate the scrambled data block, e.g., as described above.

In some demonstrative embodiments, as shown in FIG. 4, LFSR 400 may be defined by the primitive polynomial $S(x)=x^7+x+1$, for example, to generate a second random PN sequence, e.g., different from the first random PN sequence generated by LFSR 300 (FIG. 3).

In some demonstrative embodiments, devices 102 and/or 140 (FIG. 1) may be configured to implement a first LFSR, e.g., LFSR 300 (FIG. 3), to generate the first scrambling sequence s1, and a second LFSR, e.g., LFSR 400, to generate the second scrambling sequence s2.

In some demonstrative embodiments, LFSR 400 may be configured, for example, to maintain the same, e.g., some or all, PN random properties for s2 as for s1.

In some demonstrative embodiments, for example, the PN sequences generated by both the polynomials $S1(x)$ and $S2(x)$ may maintain one or more, e.g., some or all, of the following same properties:

1. Sequence period is equal to 127;
2. Hold 64 1s and 64 0s per period;
3. Keep the same statistics of burst of length N probability, proportional to ~2−N;
4. Near to zero mean value; and/or
5. Similar autocorrelation functions.

In other embodiments, the first and/or second LFSRs may be implemented according to one or more additional or alternative criteria, parameters, and/or properties.

Referring back to FIG. 1, in some demonstrative embodiments, device 102 may be configured to encode the EDMG Header B field, e.g., EDMG Header B field 216 (FIG. 2), for a SC PHY, e.g., as described below.

In some demonstrative embodiments, for example, for the SC PHY, the LDPC codeword may include 64 scrambled header bits denoted ($bq_1, bq_2, \ldots, bq_{64}$), 440 zero bits, and 168 parity bits denoted ($p_1, p_2, \ldots, p_{168}$), and the data block may include one or more repetitions of a codeword sequence $c=(c_1, c_2)$, e.g., wherein:

$$c_1=(bq_1,bq_2,\ldots,bq_{64},p_1,p_2,\ldots,p_{160})$$

$$c_2=(bq_1,bq_2,\ldots,bq_{64},p_1,p_2,\ldots p_{152},p_{161},p_{162},\ldots p_{168}).$$

In some demonstrative embodiments, controller 124 may be configured to cause, trigger, and/or control the wireless station implemented by device 102 to determine the data block, denoted cb, based on the codeword sequence c and a count, denoted $N_{CB}$, of one or more 2.16 GHz channels in a channel bandwidth for transmission of the EDMG MU PPDU, e.g., as follows:

$cb=c$ for $N_{CB}=1$;

$cb=(c,c)$ for $N_{CB}=2$;

$cb=(c,c,c)$ for $N_{CB}=3$; and $cb=(c,c,c,c)$ for $N_{CB}=4$.

In some demonstrative embodiments, controller 124 may be configured to cause, trigger, and/or control the wireless station implemented by device 102 to scramble the data block starting at a $225^{th}$ bit and ending at a $(448 \times N_{CB})^{th}$ bit, e.g., as described below.

In other embodiments, any other data block and/or scrambling scheme may be implemented.

In some demonstrative embodiments, controller 124 may be configured to cause, trigger, and/or control the wireless station implemented by device 102 to modulate the one or more scrambled data blocks according to a π/2 Binary Phased Shift Keying (π/2-BPSK) modulation, e.g., as described below.

In other embodiments, device 102 may modulate the one or more scrambled data blocks according to any other modulation scheme.

In some demonstrative embodiments, devices 102 and/or 140 may be configured to encode the EDMG Header B for an $i_{user}$-th user, for example, according to an EDMG Header B encoding scheme, which may include, for example, one or more of the following operations:

The input 64 bits of the EDMG-Header-B $b=(b_1, b_2, \ldots, b_{64})$ may be scrambled with PN sequence generated by a first LFSR, e.g., LFSR 300 (FIG. 3) or any other LFSR, for example, starting from the eighth bit to create a scrambled sequence $bq=(bq_1, bq_2, \ldots, bq_{64})$. The scrambler seed value may be initialized, for example, by the first seven bits of the EDMG-Header-B, e.g., EDMG-Header-B 216 (FIG. 2). In other embodiments, any other number of bits in the Header B field may be implemented for initializing the scrambler seed.

The LDPC codeword, e.g., of length 672 bits or any other length, may be created by concatenating a plurality of zeros, e.g., 440 zeros or any other number of zeros, to the scrambled header bits $bq=(bq_1, bq_2, \ldots, bq_{64})$ and then computing a plurality of parity bits, e.g., 168 parity bits $p=(p_1, p_2, \ldots p_{168})$ or any other number of parity bits, for example, using an LDPC matrix with R=¾ and/or $L_{CW}=672$ and/or any other parameters, e.g., in accordance with Section 20.3.8.4 of IEEE 802.11-2016 or any other Specification. The LDPC codeword may be defined, for example, as follows: $(bq_1, bq_2, \ldots, bq_{64}, 0_1, 0_2, \ldots, 0_{440}, p_1, p_2, \ldots, p_{168})$. In other embodiments, a codeword of any other length may be generated, for example, using any other number of parity bits and/or zero bits and/or according to any other encoding parameters.

The zero padded bits may be discarded and the output codeword may be defined as $c=(c_1, c_2)$, for example, wherein:

$$c_1=(bq_1,bq_2,\ldots,bq_{64},p_1,p_2,\ldots,p_{160})$$

$$c_2=(bq_1,bq_2,\ldots,bq_{64},p_1,p_2,\ldots p_{152},p_{161},p_{162},\ldots,p_{168})$$

For a PPDU transmitted over a $N_{CB} \times 2.16$ GHz channel, wherein, for example, the factor $N_{CB}$ has a value of $1 \leq N_{CB} \leq 4$ or any other factor, the data block may be defined as a repetition of codeword c by $N_{CB}$ times, e.g., as follows:

$cb=c$ for $N_{CB}=1$ $cb=(c,c)$ for $N_{CB}=2$ $cb=(c,c,c)$ for $N_{CB}=3$ $cb=(c,c,c,c)$ for $N_{CB}=4$ The data block cb may be scrambled with a second PN sequence to produce cq, for example, using a PN sequence generated by a second LFSR, e.g., LFSR 400 (FIG. 4) or any other LFSR. The scrambler seed value may be initialized, for example, to an initial seed value equal to all ones ($1_1$, $1_2$, . . . , $1_7$), or any other initial seed value. The scrambling may start, for example, at the 225-th bit and/or may end at the ($448 \times N_{CB}$)-th bit, or any other range of bits.

For a PPDU transmitted using one or more, e.g., two, space-time streams, the data block mapped to the first space-time stream may be, for example, kept unchanged. For example, the data block mapped to the second space-time stream may be circular shifted, for example, by $4 \times N_{CB}$ bits, e.g., as follows:

$$cq^{iSTS \, i_{user}=1} = cq$$

$$cq^{iSTS \, i_{user}=2} =$$
$$(cq_{4 \times N_{CB}+1}, cq_{4 \times N_{CB}+2}, \ldots, cq_{448 \times N_{CB}}, cq_1, cq_2, \ldots, cq_{4 \times N_{CB}})$$

In some demonstrative embodiments, an EDMG Header B encoding scheme may include all of the operations described above. In other embodiments, the EDMG Header B encoding scheme may include some of the operations and/or one or more additional or alternative operations.

In some demonstrative embodiments, SC data blocks, e.g., resulting from the EDMG Header B encoding, may be, for example, modulated using a $\pi/2$-BPSK modulation, e.g., in accordance with *Section* 20.6.3.2.4 *of IEEE* 802.11-2016, and/or any other modulation.

In some demonstrative embodiments, a SC data block, e.g., each SC data block, may be, for example, prepended with a guard interval, e.g., in accordance with an *IEEE* 802.11*ay Specification* and/or any other Specification.

In some demonstrative embodiments, devices 102 and/or 140 may be configured to encode the EDMG Header of the EDMG PPDU, for example, EDMG Header B 216 of EDMG PPDU 200 (FIG. 2), for example, for an OFDM PHY transmission, e.g., in accordance with an *IEEE* 802.11*ay Specification* and/or any other Specification.

In some demonstrative embodiments, devices 102 and/or 140 may be configured to generate, transmit, receive and/or process the EDMG Header B field according to an encoding scheme, which may be configured, for example, to support transmission, e.g., OFDM PHY transmission, over a 2.16 GHz channel, and/or one or more wide (bonded) channels, for example, transmission over a channel bandwidth of 4.32 GHz, 6.48 GHz, 8.64 GHz and/or any other channels bandwidths and/or bonded channels.

In some demonstrative embodiments, devices 102 and/or 140 may be configured to transmit the EDMG Header B of the EDMG PPDU by transmitting a transmission, e.g., an OFDM transmission of an OFDM signal over a plurality of OFDM subcarriers, based on the scrambled data block, e.g., as described below.

In some demonstrative embodiments, controller 124 may be configured to cause, trigger, and/or control the wireless station implemented by device 102 to encode the EDMG Header B field of the EDMG MU PPDU, e.g., EDMG Header B 216 of EDMG PPDU 200 (FIG. 2), for an OFDM PHY, e.g., as described below.

In some demonstrative embodiments, for example, for the OFDM PHY, the LDPC codeword may include 64 scrambled bits denoted ($bq_1$, $bq_2$, . . . , $bq_{64}$), 440 zero bits, and 168 parity bits denoted ($p_1$, $p_2$, . . . , $p_{168}$), and the data block may include one or more repetitions of a codeword sequence c=($c_1$, $c_2$, $c_3$), wherein:

$$c_1 = (bq_1, bq_2, \ldots, bq_{64}, p_9, p_{10}, \ldots, p_{168})$$

$$c_2 = (bq_1, bq_2, \ldots, bq_{64}, p_1, p_2, \ldots, p_{84}, p_{93}, p_{94}, \ldots, p_{168})$$

$$c_3 = (bq_1, bq_2, \ldots, bq_{64}, p_1, p_2, \ldots, p_{160}).$$

In some demonstrative embodiments, controller 124 may be configured to cause, trigger, and/or control the wireless station implemented by device 102 to determine the data block, denoted cb, based on the codeword sequence c and a count, denoted $N_{CB}$, of one or more 2.16 GHz channels in a channel bandwidth for transmission of the EDMG MU PPDU, e.g., as follows:

$$cb = c \text{ for } N_{CB} = 1;$$

$$cb = (c, c, c_{1:124}) \text{ for } N_{CB} = 2;$$

$$cb = (c, c, c, c_{1:252}) \text{ for } N_{CB} = 3; \text{ and}$$

$$cb = (c, c, c, c, c_{1:376}) \text{ for } N_{CB} = 4.$$

In some demonstrative embodiments, controller 124 may be configured to cause, trigger, and/or control the wireless station implemented by device 102 to scramble the data block starting at a $225^{th}$ bit and ending at a $(2 \times N_{SD})^{th}$ bit, wherein $N_{SD}$ denotes a number of data subcarriers, e.g., as described below.

In other embodiments, any other data block and/or scrambling scheme may be implemented.

In some demonstrative embodiments, controller 124 may be configured to cause, trigger, and/or control the wireless station implemented by device 102 to modulate the one or more scrambled data blocks according to a Quadrature Phase-Shift Keying (QPSK) modulation with Static Tone Pairing (STP), e.g., as described below.

In other embodiments, device 102 may modulate the one or more scrambled data blocks according to any other modulation scheme.

In some demonstrative embodiments, devices 102 and/or 140 may be configured to encode the EDMG Header B for an $i_{user}$-th user, for example, according to an EDMG Header B encoding scheme, which may include, for example, one or more of the following operations:

The input 64 bits of the EDMG-Header-B b=($b_1$, $b_2$, . . . , $b_{64}$) may be scrambled with a PN sequence generated by a first LFSR, for example, in compliance with *Section* 20.3.9 *of the IEEE* 802.11-216 *Specification*, e.g., LFSR 300 (FIG. 3) or any other LFSR, for example, starting from the eighth bit, to create a scrambled sequence bq=($bq_1$, $bq_2$, . . . , $bq_{64}$). The scrambler seed value may be initialized, for example, by the first seven bits of the EDMG-Header-B, e.g., as described above. In other embodiments, any other number of bits in the EDMG Header B field may be implemented for initializing the scrambler seed.

The LDPC codeword, e.g., of length 672 bits or any other length, may be created by concatenating a plurality of zeros, e.g., 440 zeros or any other number of zeros, to the scrambled header bits bq=($bq_1$, $bq_2$, . . . , $bq_{64}$) and then computing a plurality of parity bits, e.g., 168 parity bits p=($p_1$, $p_2$, . . . , $p_{168}$) or any other number of parity bits, for example, using an LDPC matrix with R=¾ and/or $L_{CW}$=672 and/or any other parameters, e.g., in accordance with *Section* 20.3.8.4 *of IEEE*

802.11-2016 and/or any other Specification. The LDPC codeword may be defined, for example, as follows: $(bq_1, bq_2, \ldots, bq_{64}, 0_1, 0_2, \ldots, 0_{440}, p_1, p_2, \ldots, p_{168})$. In other embodiments, a codeword of any other length may be generated, for example, using any other number of parity bits and/or zero bits and/or according to any other encoding parameters.

The zero padded bits may be discarded and the output codeword is defined as $c=(c_1, c_2, c_3)$, for example, wherein:

$$c_1 = (bq_1, bq_2, \ldots, bq_{64}, p_9, p_{10}, \ldots, p_{168})$$

$$c_2 = (bq_1, bq_2, \ldots, bq_{64}, p_1, p_2, \ldots, p_{84}, p_{93}, p_{94}, \ldots, p_{168})$$

$$c_3 = (bq_1, bq_2, \ldots, bq_{64}, p_1, p_2, \ldots, p_{160})$$

In other embodiments, the output codeword may be defined based on any other additional or alternative sequences.

For a PPDU transmitted over a $N_{CB} \times 2.16$ GHz channel, wherein, for example, the factor $N_{CB}$ has a value of $1 \leq N_{CB} \leq 4$ or any other factor, the data block is defined as a repetition of codeword c bits, e.g., as follows:

$$cb = c \text{ for } N_{CB}=1$$

$$cb = (c,c,c_{1:124}) \text{ for } N_{CB}=2$$

$$cb = (c,c,c,c_{1:252}) \text{ for } N_{CB}=3$$

$$cb = (c,c,c,c,c_{1:376}) \text{ for } N_{CB}=4$$

The data block cb may be scrambled with a second PN sequence to produce cq, for example, using a PN sequence generated by a second LFSR, for example, in compliance with an *IEEE 802.11ay Specification*, e.g., LFSR 400 (FIG. 4) or any other LFSR. The scrambler seed value may be initialized, for example, to an initial seed value equal to all ones $(1_1, 1_2, \ldots, 1_7)$, or any other initial seed value. The scrambling may start, for example, at the 225-th bit and/or may end at the $(2 \times N_{SD})$-th bit, or any other range of bits, e.g., as described above. For example, the parameter $N_{SD}$ may denote a number of data subcarriers, for example, for an OFDM signal, e.g., at an EDMG OFDM mode.

For a PPDU transmitted using one or more, e.g., two, space-time streams, the data block mapped to the first space-time stream may be, for example, kept unchanged. For example, the data block mapped to the second space-time stream may be circular shifted, for example, by $8 \times N_{CB}$ bits, e.g., as follows:

$$cq^{i_{STS\ i_{user}}=1} = cq$$

$$cq^{i_{STS\ i_{user}}=2} = (cq_{8 \times N_{CB}+1}, cq_{8 \times N_{CB}+2}, \ldots, cq_{2 \times N_{SD}}, cq_1, cq_2, \ldots, cq_{8 \times N_{CB}})$$

The notation $c_{1:m}$, e.g., as used above, may define an array of vector c elements, starting from the first bit (inclusive) and ending at the m-th bit (inclusive).

In some demonstrative embodiments, an EDMG Header B encoding scheme may include all of the operations described above. In other embodiments, the EDMG Header B encoding scheme may include some of the operations and/or one or more additional or alternative operations.

In some demonstrative embodiments, a data block for an $i_{STS\ i_{user}}$-th space-time stream, e.g., resulting from the EDMG Header B encoding, may be modulated, for example, using a QPSK modulation with STP, and/or any other modulation scheme.

In some demonstrative embodiments, the EDMG-Header-B may use, for example, an OFDM modulation, for example, according to an OFDM modulation defined for a data part of the PPDU including the EDMG Header B field, e.g., in compliance with an *IEEE 802.11ay Specification*.

Figure 5:
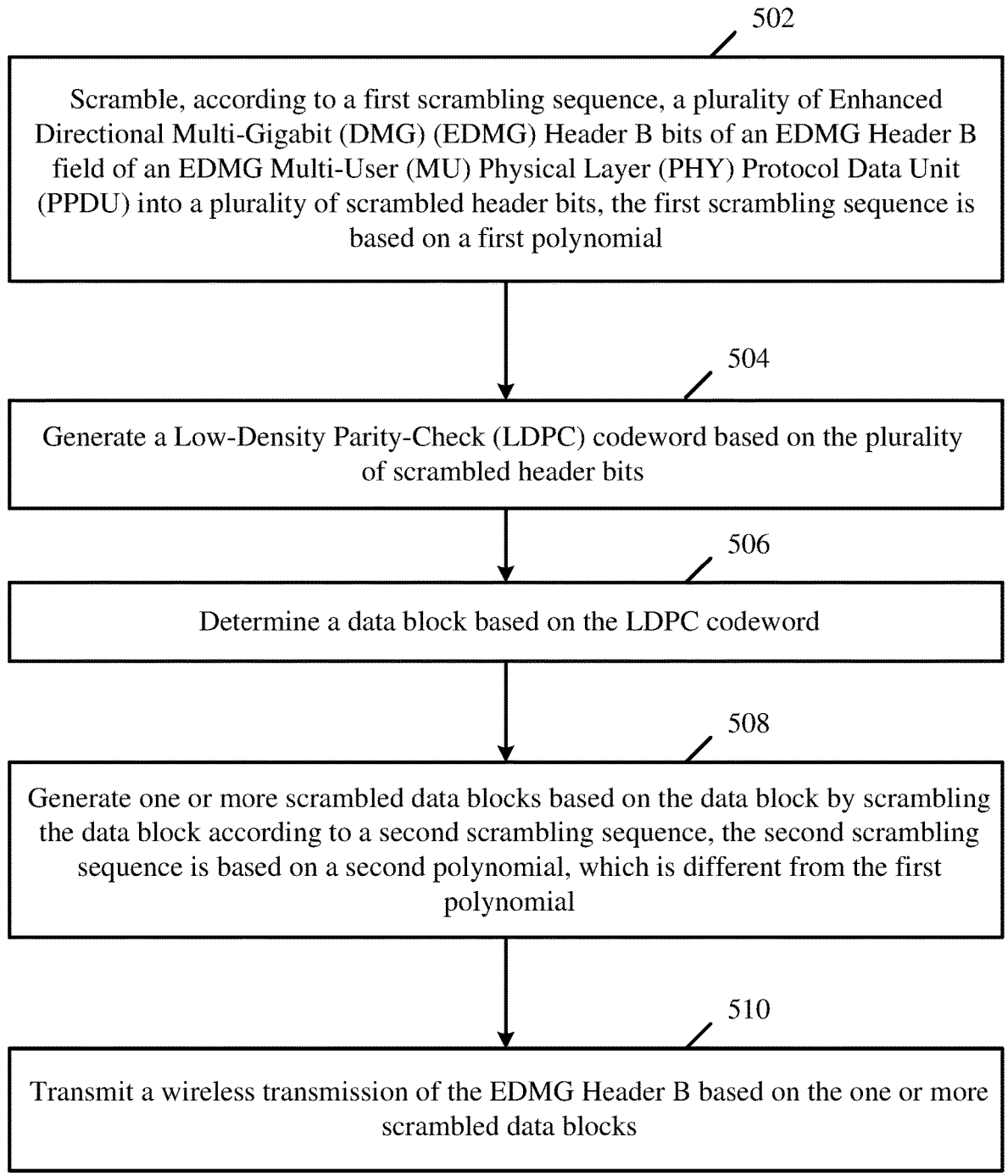
FIG. 5 is a schematic flow-chart illustration of a method of encoding a wireless transmission, in accordance with some demonstrative embodiments.

Reference is made to FIG. 5, which schematically illustrates a method of communicating an EDMG MU PPDU with a Header B field, in accordance with some demonstrative embodiments. For example, one or more of the operations of the method of FIG. 5 may be performed by one or more elements of a system, e.g., system 100 (FIG. 1), for example, one or more wireless devices, e.g., device 102 (FIG. 1), and/or device 140 (FIG. 1), a controller, e.g., controller 124 (FIG. 1) and/or controller 154 (FIG. 1), a radio, e.g., radio 114 (FIG. 1) and/or radio 144 (FIG. 1), and/or a message processor, e.g., message processor 128 (FIG. 1) and/or message processor 158 (FIG. 1).

As indicated at block 502, the method may include scrambling, according to a first scrambling sequence, a plurality of EDMG Header B bits of an EDMG Header B field of an EDMG MU PHY PPDU into a plurality of scrambled header bits. For example, controller 124 (FIG. 1) may be configured to cause, trigger, and/or control the wireless station implemented by device 102 (FIG. 1) to scramble, according to the first scrambling sequence, the plurality of EDMG Header B bits of the EDMG Header B field of the EDMG MU PHY PPDU into the plurality of scrambled header bits, e.g., as described above.

In some demonstrative embodiments, the first scrambling sequence may be based on a first polynomial, e.g., as described above.

As indicated at block 504, the method may include generating an LDPC codeword based on the plurality of scrambled header bits. For example, controller 124 (FIG. 1) may be configured to cause, trigger, and/or control the wireless station implemented by device 102 (FIG. 1) to generate the LDPC codeword based on the plurality of scrambled header bits, e.g., as described above.

As indicated at block 506, the method may include determining a data block based on the LDPC codeword. For example, controller 124 (FIG. 1) may be configured to cause, trigger, and/or control the wireless station implemented by device 102 (FIG. 1) to determine the data block based on the LDPC codeword, e.g., as described above.

As indicated at block 508, the method may include generating one or more scrambled data blocks based on the data block by scrambling the data block according to a second scrambling sequence. For example, controller 124 (FIG. 1) may be configured to cause, trigger, and/or control the wireless station implemented by device 102 (FIG. 1) to generate the one or more scrambled data blocks based on the data block by scrambling the data block according to the second scrambling sequence, e.g., as described above.

In some demonstrative embodiments, the second scrambling sequence may be based on a second polynomial, which is different from the first polynomial, e.g., as described above.

As indicated at block 510, the method may include transmitting a wireless transmission of the EDMG Header B based on the one or more scrambled data blocks. For example, controller 124 (FIG. 1) may be configured to cause, trigger, and/or control the wireless station implemented by device 102 (FIG. 1) to transmit the wireless transmission of the EDMG Header B based on the one or more scrambled data blocks, e.g., as described above.

Figure 6:
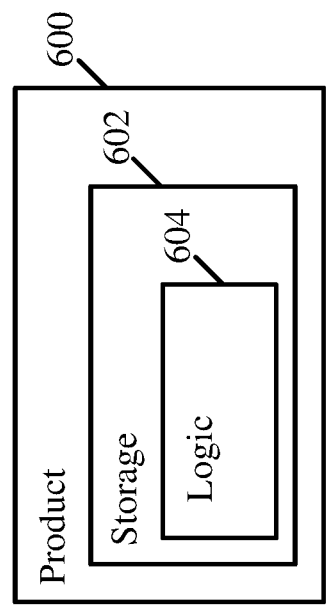
FIG. 6 is a schematic illustration of a product of manufacture, in accordance with some demonstrative embodiments.

Reference is made to FIG. 6, which schematically illustrates a product of manufacture 600, in accordance with some demonstrative embodiments. Product 600 may include one or more tangible computer-readable ("machine-readable") non-transitory storage media 602, which may include computer-executable instructions, e.g., implemented by logic 604, operable to, when executed by at least one computer processor, enable the at least one computer processor to implement one or more operations at device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), message processor 128 (FIG. 1), message processor 158 (FIG. 1), controller 124 (FIG. 1), and/or controller 154 (FIG. 1), to cause device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), message processor 128 (FIG. 1), message processor 158 (FIG. 1), controller 124 (FIG. 1), and/or controller 154 (FIG. 1) to perform, trigger and/or implement one or more operations and/or functionalities, and/or to perform, trigger and/or implement one or more operations and/or functionalities described with reference to the FIGS. 1, 2, 3, 4, and/or 5, and/or one or more operations described herein. The phrases "non-transitory machine-readable medium" and "computer-readable non-transitory storage media" may be directed to include all computer-readable media, with the sole exception being a transitory propagating signal.

In some demonstrative embodiments, product 600 and/or machine readable storage media 602 may include one or more types of computer-readable storage media capable of storing data, including volatile memory, non-volatile memory, removable or non-removable memory, erasable or non-erasable memory, writeable or rewriteable memory, and the like. For example, machine readable storage media 602 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 604 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 604 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

EXAMPLES

The following examples pertain to further embodiments.

Example 1 includes an apparatus comprising logic and circuitry configured to cause an Enhanced Directional Multi-Gigabit (DMG) (EDMG) wireless communication station (STA) to scramble, according to a first scrambling sequence, a plurality of EDMG Header B bits of an EDMG Header B field of an EDMG Multi-User (MU) Physical Layer (PHY) Protocol Data Unit (PPDU) into a plurality of scrambled header bits, the first scrambling sequence is based on a first polynomial; generate a Low-Density Parity-Check (LDPC) codeword based on the plurality of scrambled header bits; determine a data block based on the LDPC codeword; generate one or more scrambled data blocks based on the data block by scrambling the data block according to a second scrambling sequence, the second scrambling sequence is based on a second polynomial, which is different from the first polynomial; and transmit a wireless transmission of the EDMG Header B based on the one or more scrambled data blocks.

Example 2 includes the subject matter of Example 1, and optionally, wherein the first polynomial comprises the polynomial $S(x)=x^7+x^4+1$.

Example 3 includes the subject matter of Example 1 or 2, and optionally, wherein the second polynomial comprises the polynomial $S(x)=x^7+x+1$.

Example 4 includes the subject matter of any one of Examples 1-3, and optionally, wherein the apparatus is configured to cause the EDMG STA to determine the one or more scrambled data blocks according to an initial seed value equal to all ones $(1_1, 1_2, \ldots, 1_7)$.

Example 5 includes the subject matter of any one of Examples 1-4, and optionally, wherein the apparatus is configured to cause the EDMG STA to start scrambling the data block at a $225^{th}$ bit.

Example 6 includes the subject matter of any one of Examples 1-5, and optionally, wherein a count of the one or more scrambled data blocks is based on a count of one or more space-time streams for transmission of the EDMG MU PPDU.

Example 7 includes the subject matter of any one of Examples 1-6, and optionally, wherein the apparatus is configured to cause the EDMG STA to map the one or more scrambled data blocks to one or more respective space-time streams for transmission of the EDMG MU PPDU.

Example 8 includes the subject matter of Example 7, and optionally, wherein the apparatus is configured to cause the EDMG STA to generate a first scrambled data block and a second scrambled block, to map the first scrambled data block to a first space-time stream, and to map the second scrambled data block to a second space-time stream.

Example 9 includes the subject matter of any one of Examples 1-8, and optionally, wherein the apparatus is configured to cause the EDMG STA to determine a plurality of parity bits based on the plurality of scrambled header bits, and to generate the LDPC codeword based on the plurality of scrambled header bits and the plurality of parity bits.

Example 10 includes the subject matter of any one of Examples 1-8, and optionally, wherein the apparatus is configured to cause the EDMG STA to determine a codeword sequence based on the LDPC codeword, and to determine the data block to include one or more repetitions of the codeword sequence, a count of the one or more repetitions of the codeword sequence is based on a count of one or more 2.16 Gigahertz (GHz) channels in a channel bandwidth for transmission of the EDMG MU PPDU.

Example 11 includes the subject matter of any one of Examples 1-10, and optionally, comprising a first Linear Feedback Shift Register (LFSR) configured according to the first polynomial to generate the first scrambling sequence, and a second LFSR configured according to the second polynomial to generate the second scrambling sequence.

Example 12 includes the subject matter of any one of Examples 1-11, and optionally, wherein the apparatus is configured to cause the EDMG STA to generate the plurality of scrambled header bits according to a scrambler seed initialized by first seven bits of the EDMG Header B bits.

Example 13 includes the subject matter of any one of Examples 1-12, and optionally, wherein the apparatus is configured to cause the EDMG STA to encode the EDMG Header B field for a Single Carrier (SC) PHY.

Example 14 includes the subject matter of Example 13, and optionally, wherein the LDPC codeword comprises 64 scrambled header bits denoted $(bq_1, bq_2, \ldots, bq_{64})$, 440 zero bits, and 168 parity bits denoted $(p_1, p_2, \ldots, p_{168})$, and the data block comprises one or more repetitions of a codeword sequence $c=(c_1, c_2)$, wherein:

$$c_1=(bq_1,bq_2,\ldots,bq_{64},p_1,p_2,\ldots,p_{160})$$

$$c_2=(bq_1,bq_2,\ldots,bq_{64},p_1,p_2,\ldots,p_{152},p_{161}, p_{162},\ldots,p_{168}).$$

Example 15 includes the subject matter of Example 14, and optionally, wherein the apparatus is configured to cause the EDMG STA to determine the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$$cb=c \text{ for } N_{CB}=1;$$

$$cb=(c,c) \text{ for } N_{CB}=2;$$

$$cb=(c,c,c) \text{ for } N_{CB}=3; \text{ and}$$

$$cb=(c,c,c,c) \text{ for } N_{CB}=4.$$

Example 16 includes the subject matter of any one of Examples 13-15, and optionally, wherein the apparatus is configured to cause the EDMG STA to scramble the data block starting at a $225^{th}$ bit and ending at a $(448 \times N_{CB})^{th}$ bit.

Example 17 includes the subject matter of any one of Examples 13-16, and optionally, wherein the apparatus is configured to cause the EDMG STA to modulate the one or more scrambled data blocks according to a π/2 Binary Phased Shift Keying (π/2-BPSK) modulation.

Example 18 includes the subject matter of any one of Examples 1-12, and optionally, wherein the apparatus is configured to cause the EDMG STA to encode the EDMG Header B field for an Orthogonal Frequency-Division Multiplexing (OFDM) PHY.

Example 19 includes the subject matter of Example 18, and optionally, wherein the LDPC codeword comprises 64 scrambled bits denoted $(bq_1, bq_2, \ldots, bq_{64})$, 440 zero bits, and 168 parity bits denoted $(p_1, p_2, \ldots, p_{168})$, and the data block comprises one or more repetitions of a codeword sequence $c=(c_1, c_2, c_3)$, wherein:

$$c_1=(bq_1,bq_2,\ldots,bq_{64},p_9,p_{10},\ldots,p_{168})$$

$$c_2=(bq_1,bq_2,\ldots,bq_{64},p_1,p_2,\ldots,p_{84},p_{93}, p_{94},\ldots,p_{168})$$

$$c_3=(bq_1,bq_2,\ldots,bq_{64},p_1,p_2,\ldots,p_{160}).$$

Example 20 includes the subject matter of Example 19, and optionally, wherein the apparatus is configured to cause the EDMG STA to determine the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$$cb=c \text{ for } N_{CB}=1;$$

$$cb=(c,c,c_{1:124}) \text{ for } N_{CB}=2;$$

$$cb=(c,c,c,c_{1:252}) \text{ for } N_{CB}=3; \text{ and}$$

$$cb=(c,c,c,c,c_{1:376}) \text{ for } N_{CB}=4.$$

Example 21 includes the subject matter of any one of Examples 18-20, and optionally, wherein the apparatus is configured to cause the EDMG STA to scramble the data block starting at a $225^{th}$ bit and ending at a $(2 \times N_{SD})^{th}$ bit, wherein $N_{SD}$ denotes a number of data subcarriers.

Example 22 includes the subject matter of any one of Examples 18-21, and optionally, wherein the apparatus is configured to cause the EDMG STA to modulate the one or more scrambled data blocks according to a Quadrature Phase-Shift Keying (QPSK) modulation with Static Tone Pairing (STP).

Example 23 includes the subject matter of any one of Examples 1-22, and optionally, wherein the apparatus is configured to cause the EDMG STA to transmit the wireless transmission of the EDMG Header B over a channel bandwidth of 2.16 Gigahertz (GHz), 4.32 GHz, 6.48 GHz, or 8.64 GHz.

Example 24 includes the subject matter of any one of Examples 1-23, and optionally, wherein the apparatus is configured to cause the EDMG STA to transmit the wireless transmission of the EDMG Header B over a frequency band above 45 Gigahertz (GHz).

Example 25 includes the subject matter of any one of Examples 1-24, and optionally, comprising a radio.

Example 26 includes the subject matter of any one of Examples 1-25, and optionally, comprising one or more antennas.

Example 27 includes a system of wireless communication comprising an Enhanced Directional Multi-Gigabit (DMG) (EDMG) wireless communication station (STA), the EDMG STA comprising one or more antennas; a radio; a memory; a processor; and a controller configured to cause the EDMG STA to scramble, according to a first scrambling sequence, a plurality of EDMG Header B bits of an EDMG Header B field of an EDMG Multi-User (MU) Physical Layer (PHY) Protocol Data Unit (PPDU) into a plurality of scrambled header bits, the first scrambling sequence is based on a first polynomial; generate a Low-Density Parity-Check (LDPC) codeword based on the plurality of scrambled header bits; determine a data block based on the LDPC codeword; generate one or more scrambled data blocks based on the data block by scrambling the data block according to a second scrambling sequence, the second scrambling sequence is based on a second polynomial, which is different from the first polynomial; and transmit a wireless transmission of the EDMG Header B based on the one or more scrambled data blocks.

Example 28 includes the subject matter of Example 27, and optionally, wherein the first polynomial comprises the polynomial $S(x)=x^7+x^4+1$.

Example 29 includes the subject matter of Example 27 or 28, and optionally, wherein the second polynomial comprises the polynomial $S(x)=x^7+x+1$.

Example 30 includes the subject matter of any one of Examples 27-29, and optionally, wherein the controller is configured to cause the EDMG STA to determine the one or more scrambled data blocks according to an initial seed value equal to all ones $(1_1, 1_2, \ldots, 1_7)$.

Example 31 includes the subject matter of any one of Examples 27-30, and optionally, wherein the controller is configured to cause the EDMG STA to start scrambling the data block at a $225^{th}$ bit.

Example 32 includes the subject matter of any one of Examples 27-31, and optionally, wherein a count of the one or more scrambled data blocks is based on a count of one or more space-time streams for transmission of the EDMG MU PPDU.

Example 33 includes the subject matter of any one of Examples 27-32, and optionally, wherein the controller is configured to cause the EDMG STA to map the one or more scrambled data blocks to one or more respective space-time streams for transmission of the EDMG MU PPDU.

Example 34 includes the subject matter of Example 33, and optionally, wherein the controller is configured to cause the EDMG STA to generate a first scrambled data block and a second scrambled block, to map the first scrambled data block to a first space-time stream, and to map the second scrambled data block to a second space-time stream.

Example 35 includes the subject matter of any one of Examples 27-34, and optionally, wherein the controller is configured to cause the EDMG STA to determine a plurality of parity bits based on the plurality of scrambled header bits, and to generate the LDPC codeword based on the plurality of scrambled header bits and the plurality of parity bits.

Example 36 includes the subject matter of any one of Examples 27-34, and optionally, wherein the controller is configured to cause the EDMG STA to determine a codeword sequence based on the LDPC codeword, and to determine the data block to include one or more repetitions of the codeword sequence, a count of the one or more repetitions of the codeword sequence is based on a count of one or more 2.16 Gigahertz (GHz) channels in a channel bandwidth for transmission of the EDMG MU PPDU.

Example 37 includes the subject matter of any one of Examples 27-36, and optionally, wherein the EDMG STA comprises a first Linear Feedback Shift Register (LFSR) configured according to the first polynomial to generate the first scrambling sequence, and a second LFSR configured according to the second polynomial to generate the second scrambling sequence.

Example 38 includes the subject matter of any one of Examples 27-37, and optionally, wherein the controller is configured to cause the EDMG STA to generate the plurality of scrambled header bits according to a scrambler seed initialized by first seven bits of the EDMG Header B bits.

Example 39 includes the subject matter of any one of Examples 27-38, and optionally, wherein the controller is configured to cause the EDMG STA to encode the EDMG Header B field for a Single Carrier (SC) PHY.

Example 40 includes the subject matter of Example 39, and optionally, wherein the LDPC codeword comprises 64 scrambled header bits denoted $(bq_1, bq_2, \ldots, bq_{64})$, 440 zero bits, and 168 parity bits denoted $(p_1, p_2, \ldots, p_{168})$, and the data block comprises one or more repetitions of a codeword sequence $c=(c_1, c_2)$, wherein:

$$c_1=(bq_1,bq_2,\ldots,bq_{64},p_1,p_2,\ldots,p_{160})$$

$$c_2=(bq_1,bq_2,\ldots,bq_{64},p_1,p_2,\ldots,p_{152},p_{161},p_{162},\ldots,p_{168}).$$

Example 41 includes the subject matter of Example 40, and optionally, wherein the controller is configured to cause the EDMG STA to determine the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$$cb=c \text{ for } N_{CB}=1;$$

$$cb=(c,c) \text{ for } N_{CB}=2;$$

$$cb=(c,c,c) \text{ for } N_{CB}=3; \text{ and}$$

$$cb=(c,c,c,c) \text{ for } N_{CB}=4.$$

Example 42 includes the subject matter of any one of Examples 39-41, and optionally, wherein the controller is configured to cause the EDMG STA to scramble the data block starting at a $225^{th}$ bit and ending at a $(448 \times N_{CB})^{th}$ bit.

Example 43 includes the subject matter of any one of Examples 39-42, and optionally, wherein the controller is configured to cause the EDMG STA to modulate the one or more scrambled data blocks according to a $\pi/2$ Binary Phased Shift Keying ($\pi/2$-BPSK) modulation.

Example 44 includes the subject matter of any one of Examples 27-38, and optionally, wherein the controller is configured to cause the EDMG STA to encode the EDMG Header B field for an Orthogonal Frequency-Division Multiplexing (OFDM) PHY.

Example 45 includes the subject matter of Example 44, and optionally, wherein the LDPC codeword comprises 64 scrambled bits denoted $(bq_1, bq_2, \ldots, bq_{64})$, 440 zero bits, and 168 parity bits denoted $(p_1, p_2, \ldots, p_{168})$, and the data block comprises one or more repetitions of a codeword sequence $c=(c_1, c_2, c_3)$, wherein:

$$c_1=(bq_1,bq_2,\ldots,bq_{64},p_9,p_{10},\ldots,p_{168})$$

$$c_2=(bq_1,bq_2,\ldots,bq_{64},p_1,p_2,\ldots,p_{84},p_{93},p_{94},\ldots,p_{168})$$

$$c_3=(bq_1,bq_2,\ldots,bq_{64},p_1,p_2,\ldots,p_{160}).$$

Example 46 includes the subject matter of Example 45, and optionally, wherein the controller is configured to cause the EDMG STA to determine the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$$cb=c \text{ for } N_{CB}=1;$$

$$cb=(c,c,c_{1:124}) \text{ for } N_{CB}=2;$$

$$cb=(c,c,c,c_{1:252}) \text{ for } N_{CB}=3; \text{ and}$$

$$cb=(c,c,c,c,c_{1:376}) \text{ for } N_{CB}=4.$$

Example 47 includes the subject matter of any one of Examples 44-46, and optionally, wherein the controller is configured to cause the EDMG STA to scramble the data block starting at a $225^{th}$ bit and ending at a $(2 \times N_{SD})^{th}$ bit, wherein $N_{SD}$ denotes a number of data subcarriers.

Example 48 includes the subject matter of any one of Examples 44-47, and optionally, wherein the controller is configured to cause the EDMG STA to modulate the one or more scrambled data blocks according to a Quadrature Phase-Shift Keying (QPSK) modulation with Static Tone Pairing (STP).

Example 49 includes the subject matter of any one of Examples 27-48, and optionally, wherein the controller is configured to cause the EDMG STA to transmit the wireless transmission of the EDMG Header B over a channel bandwidth of 2.16 Gigahertz (GHz), 4.32 GHz, 6.48 GHz, or 8.64 GHz.

Example 50 includes the subject matter of any one of Examples 27-49, and optionally, wherein the controller is configured to cause the EDMG STA to transmit the wireless transmission of the EDMG Header B over a frequency band above 45 Gigahertz (GHz).

Example 51 includes a method to be performed at an Enhanced Directional Multi-Gigabit (DMG) (EDMG) wireless communication station (STA), the method comprising scrambling, according to a first scrambling sequence, a plurality of EDMG Header B bits of an EDMG Header B field of an EDMG Multi-User (MU) Physical Layer (PHY) Protocol Data Unit (PPDU) into a plurality of scrambled header bits, the first scrambling sequence is based on a first polynomial; generating a Low-Density Parity-Check (LDPC) codeword based on the plurality of scrambled header bits; determining a data block based on the LDPC codeword; generating one or more scrambled data blocks based on the data block by scrambling the data block according to a second scrambling sequence, the second scrambling sequence is based on a second polynomial, which is different from the first polynomial; and transmitting a wireless transmission of the EDMG Header B based on the one or more scrambled data blocks.

Example 52 includes the subject matter of Example 51, and optionally, wherein the first polynomial comprises the polynomial $S(x)=x^7+x^4+1$.

Example 53 includes the subject matter of Example 51 or 52, and optionally, wherein the second polynomial comprises the polynomial $S(x)=x^7+x+1$.

Example 54 includes the subject matter of any one of Examples 51-53, and optionally, comprising determining the one or more scrambled data blocks according to an initial seed value equal to all ones $(1_1, 1_2, \ldots, 1_7)$.

Example 55 includes the subject matter of any one of Examples 51-54, and optionally, comprising starting scrambling the data block at a $225^{th}$ bit.

Example 56 includes the subject matter of any one of Examples 51-55, and optionally, wherein a count of the one or more scrambled data blocks is based on a count of one or more space-time streams for transmission of the EDMG MU PPDU.

Example 57 includes the subject matter of any one of Examples 51-56, and optionally, comprising mapping the one or more scrambled data blocks to one or more respective space-time streams for transmission of the EDMG MU PPDU.

Example 58 includes the subject matter of Example 57, and optionally, comprising generating a first scrambled data block and a second scrambled block, mapping the first scrambled data block to a first space-time stream, and mapping the second scrambled data block to a second space-time stream.

Example 59 includes the subject matter of any one of Examples 51-58, and optionally, comprising determining a plurality of parity bits based on the plurality of scrambled header bits, and generating the LDPC codeword based on the plurality of scrambled header bits and the plurality of parity bits.

Example 60 includes the subject matter of any one of Examples 51-58, and optionally, comprising determining a codeword sequence based on the LDPC codeword, and determining the data block to include one or more repetitions of the codeword sequence, a count of the one or more repetitions of the codeword sequence is based on a count of one or more 2.16 Gigahertz (GHz) channels in a channel bandwidth for transmission of the EDMG MU PPDU.

Example 61 includes the subject matter of any one of Examples 51-60, and optionally, comprising generating the first scrambling sequence using a first Linear Feedback Shift Register (LFSR) configured according to the first polynomial, and generating the second scrambling sequence using a second LFSR configured according to the second polynomial.

Example 62 includes the subject matter of any one of Examples 51-61, and optionally, comprising generating the plurality of scrambled header bits according to a scrambler seed initialized by first seven bits of the EDMG Header B bits.

Example 63 includes the subject matter of any one of Examples 51-62, and optionally, comprising encoding the EDMG Header B field for a Single Carrier (SC) PHY.

Example 64 includes the subject matter of Example 63, and optionally, wherein the LDPC codeword comprises 64 scrambled header bits denoted $(bq_1, bq_2, \ldots, bq_{64})$, 440 zero bits, and 168 parity bits denoted $(p_1, p_2, \ldots, p_{168})$, and the data block comprises one or more repetitions of a codeword sequence $c=(c_1, c_2)$, wherein:

$$c_1=(bq_1,bq_2,\ldots,bq_{64},p_1,p_2,\ldots,p_{160})$$

$$c_2=(bq_1,bq_2,\ldots,bq_{64},p_1,p_2,\ldots,p_{152},p_{161},p_{162},\ldots,p_{168}).$$

Example 65 includes the subject matter of Example 64, and optionally, comprising determining the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$$cb=c \text{ for } N_{CB}=1;$$

$$cb=(c,c) \text{ for } N_{CB}=2;$$

$$cb=(c,c,c) \text{ for } N_{CB}=3; \text{ and}$$

$$cb=(c,c,c,c) \text{ for } N_{CB}=4.$$

Example 66 includes the subject matter of any one of Examples 63-65, and optionally, comprising scrambling the data block starting at a $225^{th}$ bit and ending at a $(448 \times N_{CB})^{th}$ bit.

Example 67 includes the subject matter of any one of Examples 63-66, and optionally, comprising modulating the one or more scrambled data blocks according to a π/2 Binary Phased Shift Keying (π/2-BPSK) modulation.

Example 68 includes the subject matter of any one of Examples 51-62, and optionally, comprising encoding the EDMG Header B field for an Orthogonal Frequency-Division Multiplexing (OFDM) PHY.

Example 69 includes the subject matter of Example 68, and optionally, wherein the LDPC codeword comprises 64 scrambled bits denoted ($bq_1, bq_2, \ldots, bq_{64}$), 440 zero bits, and 168 parity bits denoted ($p_1, p_2, \ldots, p_{168}$), and the data block comprises one or more repetitions of a codeword sequence $c=(c_1, c_2, c_3)$, wherein:

$c_1=(bq_1,bq_2,\ldots,bq_{64},p_9,p_{10},\ldots,p_{168})$ $c_2=(bq_1,bq_2,\ldots,bq_{64},p_1,p_2,\ldots,p_{84},p_{93},p_{94},\ldots,p_{168})$ $c_3=(bq_1,bq_2,\ldots,bq_{64},p_1,p_2,\ldots,p_{160})$.

Example 70 includes the subject matter of Example 69, and optionally, comprising determining the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$cb=c$ for $N_{CB}=1$;

$cb=(c,c,c_{1:124})$ for $N_{CB}=2$;

$cb=(c,c,c,c_{1:252})$ for $N_{CB}=3$; and $cb=(c,c,c,c,c_{1:376})$ for $N_{CB}=4$.

Example 71 includes the subject matter of any one of Examples 68-70, and optionally, comprising scrambling the data block starting at a $225^{th}$ bit and ending at a $(2 \times N_{SD})^{th}$ bit, wherein $N_{SD}$ denotes a number of data subcarriers.

Example 72 includes the subject matter of any one of Examples 68-71, and optionally, comprising modulating the one or more scrambled data blocks according to a Quadrature Phase-Shift Keying (QPSK) modulation with Static Tone Pairing (STP).

Example 73 includes the subject matter of any one of Examples 51-72, and optionally, comprising transmitting the wireless transmission of the EDMG Header B over a channel bandwidth of 2.16 Gigahertz (GHz), 4.32 GHz, 6.48 GHz, or 8.64 GHz.

Example 74 includes the subject matter of any one of Examples 51-73, and optionally, comprising transmitting the wireless transmission of the EDMG Header B over a frequency band above 45 Gigahertz (GHz).

Example 75 includes a product comprising one or more tangible computer-readable non-transitory storage media comprising computer-executable instructions operable to, when executed by at least one processor, enable the at least one processor to cause an Enhanced Directional Multi-Gigabit (DMG) (EDMG) wireless communication station (STA) to scramble, according to a first scrambling sequence, a plurality of EDMG Header B bits of an EDMG Header B field of an EDMG Multi-User (MU) Physical Layer (PHY) Protocol Data Unit (PPDU) into a plurality of scrambled header bits, the first scrambling sequence is based on a first polynomial; generate a Low-Density Parity-Check (LDPC) codeword based on the plurality of scrambled header bits; determine a data block based on the LDPC codeword; generate one or more scrambled data blocks based on the data block by scrambling the data block according to a second scrambling sequence, the second scrambling sequence is based on a second polynomial, which is different from the first polynomial; and transmit a wireless transmission of the EDMG Header B based on the one or more scrambled data blocks.

Example 76 includes the subject matter of Example 75, and optionally, wherein the first polynomial comprises the polynomial $S(x)=x^7+x^4+1$.

Example 77 includes the subject matter of Example 75 or 76, and optionally, wherein the second polynomial comprises the polynomial $S(x)=x^7+x+1$.

Example 78 includes the subject matter of any one of Examples 75-77, and optionally, wherein the instructions, when executed, cause the EDMG STA to determine the one or more scrambled data blocks according to an initial seed value equal to all ones $(1_1, 1_2, \ldots, 1_7)$.

Example 79 includes the subject matter of any one of Examples 75-78, and optionally, wherein the instructions, when executed, cause the EDMG STA to start scrambling the data block at a $225^{th}$ bit.

Example 80 includes the subject matter of any one of Examples 75-79, and optionally, wherein a count of the one or more scrambled data blocks is based on a count of one or more space-time streams for transmission of the EDMG MU PPDU.

Example 81 includes the subject matter of any one of Examples 75-80, and optionally, wherein the instructions, when executed, cause the EDMG STA to map the one or more scrambled data blocks to one or more respective space-time streams for transmission of the EDMG MU PPDU.

Example 82 includes the subject matter of Example 81, and optionally, wherein the instructions, when executed, cause the EDMG STA to generate a first scrambled data block and a second scrambled block, to map the first scrambled data block to a first space-time stream, and to map the second scrambled data block to a second space-time stream.

Example 83 includes the subject matter of any one of Examples 75-82, and optionally, wherein the instructions, when executed, cause the EDMG STA to determine a plurality of parity bits based on the plurality of scrambled header bits, and to generate the LDPC codeword based on the plurality of scrambled header bits and the plurality of parity bits.

Example 84 includes the subject matter of any one of Examples 75-82, and optionally, wherein the instructions, when executed, cause the EDMG STA to determine a codeword sequence based on the LDPC codeword, and to determine the data block to include one or more repetitions of the codeword sequence, a count of the one or more repetitions of the codeword sequence is based on a count of one or more 2.16 Gigahertz (GHz) channels in a channel bandwidth for transmission of the EDMG MU PPDU.

Example 85 includes the subject matter of any one of Examples 75-84, and optionally, wherein the instructions, when executed, cause the EDMG STA to generate the first scrambling sequence using a first Linear Feedback Shift Register (LFSR) configured according to the first polynomial, and to generate the second scrambling sequence using a second LFSR configured according to the second polynomial.

Example 86 includes the subject matter of any one of Examples 75-85, and optionally, wherein the instructions, when executed, cause the EDMG STA to generate the plurality of scrambled header bits according to a scrambler seed initialized by first seven bits of the EDMG Header B bits.

Example 87 includes the subject matter of any one of Examples 75-86, and optionally, wherein the instructions, when executed, cause the EDMG STA to encode the EDMG Header B field for a Single Carrier (SC) PHY.

Example 88 includes the subject matter of Example 87, and optionally, wherein the LDPC codeword comprises 64 scrambled header bits denoted ($bq_1, bq_2, \ldots, bq_{64}$), 440 zero bits, and 168 parity bits denoted ($p_1, p_2, \ldots, p_{168}$), and the data block comprises one or more repetitions of a codeword sequence $c=(c_1, c_2)$, wherein:

$c_1=(bq_1, bq_2, \ldots, bq_{64}, p_1, p_2, \ldots, p_{160})$ $c_2=(bq_1, bq_2, \ldots, bq_{64}, p_1, p_2, \ldots, p_{152}, p_{161}, p_{162}, \ldots, p_{168})$.

Example 89 includes the subject matter of Example 88, and optionally, wherein the instructions, when executed, cause the EDMG STA to determine the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$cb=c$ for $N_{CB}=1$;

$cb=(c,c)$ for $N_{CB}=2$;

$cb=(c,c,c)$ for $N_{CB}=3$; and $cb=(c,c,c,c)$ for $N_{CB}=4$.

Example 90 includes the subject matter of any one of Examples 87-89, and optionally, wherein the instructions, when executed, cause the EDMG STA to scramble the data block starting at a $225^{th}$ bit and ending at a $(448 \times N_{CB})^{th}$ bit.

Example 91 includes the subject matter of any one of Examples 87-90, and optionally, wherein the instructions, when executed, cause the EDMG STA to modulate the one or more scrambled data blocks according to a π/2 Binary Phased Shift Keying (π/2-BPSK) modulation.

Example 92 includes the subject matter of any one of Examples 75-86, and optionally, wherein the instructions, when executed, cause the EDMG STA to encode the EDMG Header B field for an Orthogonal Frequency-Division Multiplexing (OFDM) PHY.

Example 93 includes the subject matter of Example 92, and optionally, wherein the LDPC codeword comprises 64 scrambled bits denoted ($bq_1, bq_2, \ldots, bq_{64}$), 440 zero bits, and 168 parity bits denoted ($p_1, p_2, \ldots, p_{168}$), and the data block comprises one or more repetitions of a codeword sequence $c=(c_1, c_2, c_3)$, wherein:

$c_1=(bq_1, bq_2, \ldots, bq_{64}, p_9, p_{10}, \ldots, p_{168})$ $c_2=(bq_1, bq_2, \ldots, bq_{64}, p_1, p_2, \ldots, p_{84}, p_{93}, p_{94}, \ldots, p_{168})$ $c_3=(bq_1, bq_2, \ldots, bq_{64}, p_1, p_2, \ldots, p_{160})$.

Example 94 includes the subject matter of Example 93, and optionally, wherein the instructions, when executed, cause the EDMG STA to determine the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$cb=c$ for $N_{CB}=1$;

$cb=(c,c,c_{1:124})$ for $N_{CB}=2$;

$cb=(c,c,c,c_{1:252})$ for $N_{CB}=3$; and $cb=(c,c,c,c,c_{1:376})$ for $N_{CB}=4$.

Example 95 includes the subject matter of any one of Examples 92-94, and optionally, wherein the instructions, when executed, cause the EDMG STA to scramble the data block starting at a $225^{th}$ bit and ending at a $(2 \times N_{SD})^{th}$ bit, wherein $N_{SD}$ denotes a number of data subcarriers.

Example 96 includes the subject matter of any one of Examples 92-95, and optionally, wherein the instructions, when executed, cause the EDMG STA to modulate the one or more scrambled data blocks according to a Quadrature Phase-Shift Keying (QPSK) modulation with Static Tone Pairing (STP).

Example 97 includes the subject matter of any one of Examples 75-96, and optionally, wherein the instructions, when executed, cause the EDMG STA to transmit the wireless transmission of the EDMG Header B over a channel bandwidth of 2.16 Gigahertz (GHz), 4.32 GHz, 6.48 GHz, or 8.64 GHz.

Example 98 includes the subject matter of any one of Examples 75-97, and optionally, wherein the instructions, when executed, cause the EDMG STA to transmit the wireless transmission of the EDMG Header B over a frequency band above 45 Gigahertz (GHz).

Example 99 includes an apparatus of wireless communication by an Enhanced Directional Multi-Gigabit (DMG) (EDMG) wireless communication station (STA), the apparatus comprising means for scrambling, according to a first scrambling sequence, a plurality of EDMG Header B bits of an EDMG Header B field of an EDMG Multi-User (MU) Physical Layer (PHY) Protocol Data Unit (PPDU) into a plurality of scrambled header bits, the first scrambling sequence is based on a first polynomial; means for generating a Low-Density Parity-Check (LDPC) codeword based on the plurality of scrambled header bits; means for determining a data block based on the LDPC codeword; means for generating one or more scrambled data blocks based on the data block by scrambling the data block according to a second scrambling sequence, the second scrambling sequence is based on a second polynomial, which is different from the first polynomial; and means for transmitting a wireless transmission of the EDMG Header B based on the one or more scrambled data blocks.

Example 100 includes the subject matter of Example 99, and optionally, wherein the first polynomial comprises the polynomial $S(x)=x^7+x^4+1$.

Example 101 includes the subject matter of Example 99 or 100, and optionally, wherein the second polynomial comprises the polynomial $S(x)=x^7+x+1$.

Example 102 includes the subject matter of any one of Examples 99-101, and optionally, comprising means for determining the one or more scrambled data blocks according to an initial seed value equal to all ones $(1_1, 1_2, \ldots, 1_7)$.

Example 103 includes the subject matter of any one of Examples 99-102, and optionally, comprising means for starting scrambling the data block at a $225^{th}$ bit.

Example 104 includes the subject matter of any one of Examples 99-103, and optionally, wherein a count of the one or more scrambled data blocks is based on a count of one or more space-time streams for transmission of the EDMG MU PPDU.

Example 105 includes the subject matter of any one of Examples 99-104, and optionally, comprising means for mapping the one or more scrambled data blocks to one or more respective space-time streams for transmission of the EDMG MU PPDU.

Example 106 includes the subject matter of Example 105, and optionally, comprising means for generating a first scrambled data block and a second scrambled block, mapping the first scrambled data block to a first space-time stream, and mapping the second scrambled data block to a second space-time stream.

Example 107 includes the subject matter of any one of Examples 99-106, and optionally, comprising means for determining a plurality of parity bits based on the plurality of scrambled header bits, and generating the LDPC codeword based on the plurality of scrambled header bits and the plurality of parity bits.

Example 108 includes the subject matter of any one of Examples 99-106, and optionally, comprising means for determining a codeword sequence based on the LDPC codeword, and determining the data block to include one or more repetitions of the codeword sequence, a count of the one or more repetitions of the codeword sequence is based on a count of one or more 2.16 Gigahertz (GHz) channels in a channel bandwidth for transmission of the EDMG MU PPDU.

Example 109 includes the subject matter of any one of Examples 99-108, and optionally, comprising means for generating the first scrambling sequence using a first Linear Feedback Shift Register (LFSR) configured according to the first polynomial, and generating the second scrambling sequence using a second LFSR configured according to the second polynomial.

Example 110 includes the subject matter of any one of Examples 99-109, and optionally, comprising means for generating the plurality of scrambled header bits according to a scrambler seed initialized by first seven bits of the EDMG Header B bits.

Example 111 includes the subject matter of any one of Examples 99-110, and optionally, comprising means for encoding the EDMG Header B field for a Single Carrier (SC) PHY.

Example 112 includes the subject matter of Example 111, and optionally, wherein the LDPC codeword comprises 64 scrambled header bits denoted ($bq_1, bq_2, \ldots, bq_{64}$), 440 zero bits, and 168 parity bits denoted ($p_1, p_2, \ldots, p_{168}$), and the data block comprises one or more repetitions of a codeword sequence $c=(c_1, c_2)$, wherein:

$$c_1=(bq_1,bq_2,\ldots,bq_{64},p_1,p_2,\ldots,p_{160})$$

$$c_2=(bq_1,bq_2,\ldots,bq_{64},p_1,p_2,\ldots,p_{152},p_{161},p_{162},\ldots,p_{168}).$$

Example 113 includes the subject matter of Example 112, and optionally, comprising means for determining the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$$cb=c \text{ for } N_{CB}=1;$$

$$cb=(c,c) \text{ for } N_{CB}=2;$$

$$cb=(c,c,c) \text{ for } N_{CB}=3; \text{ and}$$

$$cb=(c,c,c,c) \text{ for } N_{CB}=4.$$

Example 114 includes the subject matter of any one of Examples 111-113, and optionally, comprising means for scrambling the data block starting at a $225^{th}$ bit and ending at a $(448 \times N_{CB})^{th}$ bit.

Example 115 includes the subject matter of any one of Examples 111-114, and optionally, comprising means for modulating the one or more scrambled data blocks according to a π/2 Binary Phased Shift Keying (π/2-BPSK) modulation.

Example 116 includes the subject matter of any one of Examples 99-115, and optionally, comprising means for encoding the EDMG Header B field for an Orthogonal Frequency-Division Multiplexing (OFDM) PHY.

Example 117 includes the subject matter of Example 116, and optionally, wherein the LDPC codeword comprises 64 scrambled bits denoted ($bq_1, bq_2, \ldots, bq_{64}$), 440 zero bits, and 168 parity bits denoted ($p_1, p_2, \ldots, p_{168}$), and the data block comprises one or more repetitions of a codeword sequence $c=(c_1, c_2, c_3)$, wherein:

$$c_1=(bq_1,bq_2,\ldots,bq_{64},p_9,p_{10},\ldots,p_{168})$$

$$c_2=(bq_1,bq_2,\ldots,bq_{64},p_1,p_2,\ldots,p_{84},p_{93},p_{94},\ldots,p_{168})$$

$$c_3=(bq_1,bq_2,\ldots,bq_{64},p_1,p_2,\ldots,p_{160}).$$

Example 118 includes the subject matter of Example 117, and optionally, comprising means for determining the data block, denoted cb, based on the codeword sequence c and a count, denoted $N_{CB}$, of one or more 2.16 Gigahertz (GHz) channels in a channel bandwidth for transmission of the EDMG MU PPDU, as follows:

$$cb=c \text{ for } N_{CB}=1;$$

$$cb=(c,c,c_{1:124}) \text{ for } N_{CB}=2;$$

$$cb=(c,c,c,c_{1:252}) \text{ for } N_{CB}=3; \text{ and}$$

$$cb=(c,c,c,c,c_{1:376}) \text{ for } N_{CB}=4.$$

Example 119 includes the subject matter of any one of Examples 116-118, and optionally, comprising means for scrambling the data block starting at a $225^{th}$ bit and ending at a $(2 \times N_{SD})^{th}$ bit, wherein $N_{SD}$ denotes a number of data subcarriers.

Example 120 includes the subject matter of any one of Examples 116-119, and optionally, comprising means for modulating the one or more scrambled data blocks according to a Quadrature Phase-Shift Keying (QPSK) modulation with Static Tone Pairing (STP).

Example 121 includes the subject matter of any one of Examples 99-120, and optionally, comprising means for transmitting the wireless transmission of the EDMG Header B over a channel bandwidth of 2.16 Gigahertz (GHz), 4.32 GHz, 6.48 GHz, or 8.64 GHz.

Example 122 includes the subject matter of any one of Examples 99-121, and optionally, comprising means for transmitting the wireless transmission of the EDMG Header B over a frequency band above 45 Gigahertz (GHz).

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:
1. An apparatus comprising:
a processor comprising logic and circuitry configured to cause an Enhanced Directional Multi-Gigabit (DMG) (EDMG) wireless communication station (STA) to:

scramble a plurality of EDMG Header B bits into a plurality of scrambled header bits according to a first scrambling sequence, the first scrambling sequence is based on a first polynomial;

generate a Low-Density Parity-Check (LDPC) codeword based on the plurality of scrambled header bits;

determine a data block comprising a codeword sequence based on the LDPC codeword, wherein the codeword sequence comprises a concatenation of a first encoded sequence, a second encoded sequence, and a third encoded sequence, wherein the second encoded sequence is different from the first encoded sequence, wherein the third encoded sequence is different from each of the first and second encoded sequences, and wherein the first encoded sequence, the second encoded sequence, and the third encoded sequence are based on the LDPC codeword;

generate one or more scrambled data blocks by scrambling the data block according to a second scrambling sequence, the second scrambling sequence is based on a second polynomial, which is different from the first polynomial; and transmit an EDMG Header B field of an EDMG Orthogonal Frequency-Division Multiplexing (OFDM) Multi-User (MU) Physical Layer (PHY) Protocol Data Unit (PPDU) based on the one or more scrambled data blocks; and a memory to store information processed by the processor.

2. The apparatus of claim 1, wherein the first polynomial is $S(x)=x^7+x^4+1$.

3. The apparatus of claim 1, wherein the second polynomial is $S(x)=x^7+x+1$.

4. The apparatus of claim 1, wherein the data block comprises one or more repetitions of the codeword sequence, a count of the one or more repetitions of the codeword sequence is based on a count of one or more 2.16 Gigahertz (GHz) channels in a channel bandwidth for transmission of the EDMG OFDM MU PPDU.

5. The apparatus of claim 1, wherein the LDPC codeword comprises 64 scrambled header bits denoted ($bq_1$, $bq_2$, ..., $bq_{64}$), 440 zero bits, and 168 parity bits denoted ($p_1$, $p_2$, ..., $p_{168}$), wherein the codeword sequence comprises the sequence $c=(c_1, c_2, c_3)$, which comprises the concatenation of the first encoded sequence, denoted $c_1$, the second encoded sequence, denoted $c_2$, and the third encoded sequence, denoted $c_3$, wherein:

$c_1=(bq_1,bq_2,bq_{64},p_9,p_{10},p_{168})$ $c_2=(bq_1,bq_2,bq_{64},p_1,p_2,p_{84},p_{93},p_{94},p_{168})$ $c_3=(bq_1,bq_2,bq_{64},p_1,p_2,p_{160})$.

6. The apparatus of claim 5 configured to cause the EDMG STA to determine the data block, denoted cb, based on the codeword sequence c and a count, denoted $N_{CB}$, of one or more 2.16 Gigahertz (GHz) channels in a channel bandwidth for transmission of the EDMG OFDM MU PPDU, as follows:

$cb=c$ for $N_{CB}=1$;

$cb=(c,c,c_{1:124})$ for $N_{CB}=2$ $cb=(c,c,c,c_{1:252})$ for $N_{CB}=3$ $cb=(c,c,c,c,c_{1:376})$ for $N_{CB}=4$ wherein $c_{1:m}$ denotes an array of elements of the codeword sequence c starting from a first bit (inclusive) and ending at an m-th bit (inclusive).

7. The apparatus of claim 1 configured to cause the EDMG STA to scramble the data block starting at a $225^{th}$ bit and ending at a $(2\times N_{SD})^{th}$ bit, wherein $N_{SD}$ denotes a number of data subcarriers.

8. The apparatus of claim 1, wherein a count of the one or more scrambled data blocks is based on a count of one or more space-time streams for transmission of the EDMG OFDM MU PPDU.

9. The apparatus of claim 1 configured to cause the EDMG STA to map the one or more scrambled data blocks to one or more respective space-time streams for transmission of the EDMG OFDM MU PPDU.

10. The apparatus of claim 9 configured to cause the EDMG STA to generate a first scrambled data block and a second scrambled data block based on the data block, to map the first scrambled data block to a first space-time stream, and to map the second scrambled data block to a second space-time stream.

11. The apparatus of claim 1 configured to cause the EDMG STA to generate the plurality of scrambled header bits according to a scrambler seed initialized by first seven bits of the plurality of EDMG Header B bits.

12. The apparatus of claim 1 configured to cause the EDMG STA to generate the one or more scrambled data blocks according to an initial seed value equal to all ones ($1_1$, $1_2$, ..., $1_7$).

13. The apparatus of claim 1 configured to cause the EDMG STA to modulate the one or more scrambled data blocks according to a Quadrature Phase-Shift Keying (QPSK) modulation.

14. The apparatus of claim 1 configured to cause the EDMG STA to modulate the one or more scrambled data blocks according to a same OFDM modulation as a data part of the EDMG OFDM MU PPDU.

15. The apparatus of claim 1 configured to cause the EDMG STA to determine 168 parity bits based on a concatenation of the plurality of scrambled header bits with 440 zero bits, and to generate the LDPC codeword based on the plurality of scrambled header bits, the 440 zero bits, and the 168 parity bits.

16. The apparatus of claim 1 configured to cause the EDMG STA to transmit the EDMG OFDM MU PPDU over a channel bandwidth of at least 2.16 Gigahertz (GHz) in a frequency band above 45 GHz.

17. The apparatus of claim 16 configured to cause the EDMG STA to transmit the EDMG OFDM MU PPDU over a channel bandwidth of 4.32 GHz, 6.48 GHz, or 8.64 GHz.

18. The apparatus of claim 1 comprising a radio, the processor configured to cause the radio to transmit the EDMG OFDM MU PPDU.

19. The apparatus of claim 18 comprising one or more antennas connected to the radio, and another processor to execute instructions of an operating system.

20. A product comprising one or more tangible computer-readable non-transitory storage media comprising computer-executable instructions operable to, when executed by at least one processor, enable the at least one processor to cause an Enhanced Directional Multi-Gigabit (DMG) (EDMG) wireless communication station (STA) to:

scramble a plurality of EDMG Header B bits into a plurality of scrambled header bits according to a first scrambling sequence, the first scrambling sequence is based on a first polynomial;

generate a Low-Density Parity-Check (LDPC) codeword based on the plurality of scrambled header bits;

determine a data block comprising a codeword sequence based on the LDPC codeword, wherein the codeword sequence comprises a concatenation of a first encoded sequence, a second encoded sequence, and a third encoded sequence, wherein the second encoded sequence is different from the first encoded sequence, wherein the third encoded sequence is different from each of the first and second encoded sequences, and wherein the first encoded sequence, the second encoded sequence, and the third encoded sequence are based on the LDPC codeword;

generate one or more scrambled data blocks by scrambling the data block according to a second scrambling sequence, the second scrambling sequence is based on a second polynomial, which is different from the first polynomial; and transmit an EDMG Header B field of an EDMG Orthogonal Frequency-Division Multiplexing (OFDM) Multi-User (MU) Physical Layer (PHY) Protocol Data Unit (PPDU) based on the one or more scrambled data blocks.

21. The product of claim 20, wherein the second polynomial is $S(x)=x^7+x+1$.

22. The product of claim 20, wherein the data block comprises one or more repetitions of the codeword sequence, a count of the one or more repetitions of the codeword sequence is based on a count of one or more 2.16 Gigahertz (GHz) channels in a channel bandwidth for transmission of the EDMG OFDM MU PPDU.

23. An apparatus comprising:

message processing means for causing an Enhanced Directional Multi-Gigabit (DMG) (EDMG) wireless communication station (STA) to generate one or more scrambled data blocks by:

scrambling a plurality of EDMG Header B bits into a plurality of scrambled header bits according to a first scrambling sequence, the first scrambling sequence is based on a first polynomial;

generating a Low-Density Parity-Check (LDPC) codeword based on the plurality of scrambled header bits;

determining a data block comprising a codeword sequence based on the LDPC codeword, wherein the codeword sequence comprises a concatenation of a first encoded sequence, a second encoded sequence, and a third encoded sequence, wherein the second encoded sequence is different from the first encoded sequence, wherein the third encoded sequence is different from each of the first and second encoded sequences, and wherein the first encoded sequence, the second encoded sequence, and the third encoded sequence are based on the LDPC codeword; and generating the one or more scrambled data blocks by scrambling the data block according to a second scrambling sequence, the second scrambling sequence is based on a second polynomial, which is different from the first polynomial; and control means for causing the EDMG STA to transmit an EDMG Header B field of an EDMG Orthogonal Frequency-Division Multiplexing (OFDM) Multi-User (MU) Physical Layer (PHY) Protocol Data Unit (PPDU) based on the one or more scrambled data blocks.

24. The apparatus of claim 23, wherein a count of the one or more scrambled data blocks is based on a count of one or more space-time streams for transmission of the EDMG OFDM MU PPDU.

* * * * *